(12) United States Patent
Ramadan et al.

(10) Patent No.: US 7,791,440 B2
(45) Date of Patent: Sep. 7, 2010

(54) MICROFABRICATED SYSTEM FOR MAGNETIC FIELD GENERATION AND FOCUSING

(75) Inventors: Qasem Ramadan, Singapore (SG); Victor Samper, Singapore (SG); Daniel Puiu Poenar, Singapore (SG); Chen Yu, Singapore (SG)

(73) Assignees: Agency For Science, Technology And Research, Singapore (SG); Nanyang Technological University, Singapore (SG)

(*) Notice: Subject to any disclaimer, the term of this patent is extended or adjusted under 35 U.S.C. 154(b) by 815 days.

(21) Appl. No.: 10/988,266

(22) Filed: Nov. 12, 2004

(65) Prior Publication Data

US 2005/0275497 A1   Dec. 15, 2005

Related U.S. Application Data

(60) Provisional application No. 60/578,416, filed on Jun. 9, 2004.

(51) Int. Cl.
  *H01F 3/00*   (2006.01)
  *H01F 5/00*   (2006.01)
(52) U.S. Cl. .................. 335/296; 335/297; 335/299; 336/192; 336/200; 336/221; 336/225
(58) Field of Classification Search ................ 29/602, 29/605, 846; 336/200, 232, 192, 221, 225; 335/296, 297, 299
  See application file for complete search history.

(56) References Cited

U.S. PATENT DOCUMENTS

| | | | |
|---|---|---|---|
| 5,788,854 A * | 8/1998 | Desaigoudar et al. | 216/13 |
| 6,140,228 A | 10/2000 | Shan et al. | 438/653 |
| 6,495,019 B1 | 12/2002 | Filas et al. | 205/119 |
| 6,560,864 B1 | 5/2003 | Chang et al. | 29/846 |

(Continued)

FOREIGN PATENT DOCUMENTS

JP  2003197452  7/2003

(Continued)

OTHER PUBLICATIONS

L.J. Guerin et al., "High aspect ratio planar coils embedded in SU8 photoepoxy for MEMS applications", in Proc. Eurosensors, vol. XII, IOP Pub. Ltd., Sep. 13-16, 1998, pp. 11-14.

(Continued)

*Primary Examiner*—Ramon M Barrera
(74) *Attorney, Agent, or Firm*—Saile Ackerman LLC; Stephen B. Ackerman

(57) ABSTRACT

A method of forming, in or on a Si substrate, planar micro-coils with coil windings of high aspect ratio (>3) and a wide variety of geometric shapes. The micro-coils may be formed on a Si substrate and be embedded in a dielectric, or they may be formed in trenches within a Si substrate. The micro-coils may have field enhancing ferromagnetic pillars rising above the micro-coil plane, formed at positions of maximum magnetic field strength and the micro-coils may also include magnetic layers formed beneath the substrate and contacting the pillars to form a substantially closed pathway for the magnetic flux. The substrate may be thinned to membrane proportions. These micro-coils produce strong magnetic fields with strong field gradients and can be used in a wide variety of processes that involve the exertion of strong magnetic forces at small distances or the creation of magnetic wells for trapping and manipulating small particles.

7 Claims, 23 Drawing Sheets

U.S. PATENT DOCUMENTS

| | | | |
|---|---|---|---|
| 6,696,910 B2 | 2/2004 | Nuytkens et al. | 336/200 |
| 7,227,719 B2 * | 6/2007 | Sasaki et al. | 360/125.39 |
| 2003/0222648 A1 | 12/2003 | Fan | 324/318 |

OTHER PUBLICATIONS

"Magnetic Wires in MEMS and Bio-Medical Applications", by Mladen Barbia, Jrnl. of Magnetism and Magnetic Mat. 249 (2002) 357-367, Elsevier Science B.V.

"Implantable Planar RF Microcoils for NMR Microspectroscopy", by L. Renaud et al., Sensors and Actuators A 99 (2002) 244-248, Elsevier Science B.V.

"Characterization of a Planar Microcoil for Implantable Microsystems", by C.R. Neagu et al., Sensors and Actuators A 62 (1997) 599-611, Elsevier Science S.A.

"Electromagnetic Optical Switch for Optical Network Communication", by Shen et al., Jrnl. of Magnetism and Magnetic Materials 239 (2002), 610-613.

"Micromachined Semi-Encapsulated Spiral Inductors for Micro Electro Mechanical Systems (MEMS) Applications", by Sadler et al., IEEE Trans. on Mag.,vol. 33, No. 5, Sep. 1997 pp. 3319-3321.

"Electromagnetic Optical Switch for Optical Network Communication", by Sheng-Chih Shen et al., Jrnl. of Magnetism and Magnetic Materials 239 (2002) 610-613.

"A New Toroidal-Meander Type Integrated Inductor with a Multi-level Magnetic Core," by Chong H. Ahn et al., IEEE Trans. on Magnetics, vol. 30, No. 1, Jan. 1994, pp. 73-79.

"On-Chip 3D Air Core Micro-Inductor for High Frequency Applications Using Deformation of Sacrificial Poylymer", by Chomnawang et al., Smart Struc. + Mat. 2001:Smart Elec. + MEMS, Proc. of SPIE, vol. 4334, pp. 54-62.

"Scanning Probe Electromagnetic Tweezers", by Mladen Barbic et al., App. Phys. Lett., vol. 79, No. 12, Sep. 17, 2001, pp. 1897-1899.

"Electroless Nickel Plating", by Wolfgang Riedel, ASM Int'l, Finishing Pub. Ltd., England, 1989, pp. 104-106.

\* cited by examiner

MICROFABRICATED SYSTEM FOR MAGNETIC FIELD GENERATION AND FOCUSING

PRIORITY

This Application claims the priority of the Provisional Application Ser. No. 60/578,416, Filing Date Jun. 9, 2004, which is fully incorporated herein by reference.

BACKGROUND OF THE INVENTION

1. Field of the Invention

This invention relates generally to the fabrication of micro electromagnetic devices such as micro electromagnetic coils, which can be used as transducers within micro electromechanical systems (MEMS).

2. Description of the Related Art

The majority of MEMS transducers have been electrostatically driven due to their ease of fabrication and integration with other micro components. On the other hand, the fabrication of magnetically actuated transducers has generally been avoided due to lack of processing knowledge and the difficulty of integrating magnetic components with other microsystems and circuits. In spite of poor scaling of magnetic forces, there is at present a growing interest in magnetic micro-devices, mainly due to their inherent unique advantages, among which is the ability of magnetic-based actuators to generate large magnetic forces.

Miniaturization needs to take into consideration many factors other than down-scaling, particularly when magnetic forces are utilized in applications other than microactuators, such as bio-medical applications. As Barbic points out (Mladen Barbie, "Magnetic wires in MEMS and bio-medical applications," J. of Magnetism and Magnetic Materials, 249 (2002) 357-367) magnetic components can generally create larger forces at larger distances than electrostatic-based components, because the energy stored in a gap between magnetized components is larger than that stored between charged plates, which is true for a gap size as small as 10 nm.

In addition, since the magnetic materials are responsive to magnetic fields and magnetic field gradients generated by current carrying wires, magnetic devices tend to be low impedance current-driven devices, rather than being high impedance voltage controlled devices, which is the case for electrostatic actuators.

Several attractive features of micro-magnetic devices that make them strong candidates for use in biomedical applications are:

1. The small size of micro-magnetic wires generates large magnetic field gradients and correspondingly large forces, since $F_{mag} \propto \nabla B$.

2. Magnetic devices can generate large forces at larger distances than electrostatic devices, which only exert large forces at small distances.

3. Using magnetic devices in bio-medical separation techniques is more efficient, non-destructive and gentle in nature and exhibits excellent selectivity. The magnetic force is exerted only on the target (e.g. a magnetic bead-cell complex) since this is the only magnetic object in the analyzed sample that exhibits a μ different from the surrounding environment. In the case of electrostatic devices, the electrostatic forces are exerted (unequally) on both the target and other objects in the sample, leading to unavoidable attraction of undesired particles together with the target, thus resulting in poor selectivity.

Magnetic micro-actuators and sensors have been fabricated for many years and, until now, they were realized simply as scaled-down versions of their macroscopic counterparts, such as electromagnetic motors, magnetometers and sensors. Their electromagnetic interaction is mainly due to the use of external micro-coils or micro-permanent magnets. It is well known, however, that it is a challenging, time consuming and expensive task to construct micro-coils using classical methods, or to hand-machine large pieces of permanent magnetic material into micro-permanent magnets, for the purposes of constructing micro-devices. The fabrication of micro-coils, in particular, poses critical problems, because the coils are three-dimensional and micro-fabrication is typically two-dimensional. The invention proposed herein not only eliminates these problems, but also integrates ferromagnetic materials into the MEMS devices. In doing so, the invention benefits from the advantages of silicon micro-machining technologies well known in the integrated circuit (IC) industry.

In order to make use of and benefit from silicon (Si) based IC technology in the fabrication of micro-magnetic devices, problems relating to usable materials must be solved. In particular, consideration must be given to the Joule heating that occurs when injecting large currents into highly resistive structures and to the compatibility of bulk magnetic materials with micro-scale processing. In an initial approach to the invention, two components are obtained: 1) highly conductive materials, such as Cu, which are needed to withstand the large currents required to produce significant magnetic fluxes, are employed in forming a planar micro-coil that is embedded in Si-micromachined structures; and 2) a magnetic core is realized using soft (low coercivity) magnetic materials such as CoNiP alloys, which must also be compatible with semiconductor fabrication techniques.

The fundamental components of any electromagnetic device are the coil and the core. Coils for generating magnetic fields are of two types, planar and three-dimensional. Planar coils are generally formed in either a spiral shape (square or circular coil of decreasing dimension) or meander shape (convoluted windings generally in the form of repeated loops). In the case of planar micro-coils, standard IC technology can be used and a current can be injected to produce an appropriate magnetic flux. In the case of three-dimensional micro-coils, however, a more advanced fabrication process is required, employing technologies such as wafer bonding and through-via connections. Since all coils, planar or three-dimensional, macroscopic or microscopic, are current-driven devices and since the maximum injected current is limited by Joule heating, the coil resistance must be minimized. To do this, it is desirable to construct coils of large cross-sectional area, short length and to use the highest conductivity material available within the fabrication process.

Most of the planar micro-coils have been fabricated by depositing the conductor material (e.g. a metal) as a thick film on top of a Si surface. These planar micro-coils can be formed with or without a core. For example, spiral inductors have been fabricated for use in NMR microscopy. L. Renaud et al., "Implantable planar rf microcoils for NMR microspectroscopy," Sensors and Actuators A 99 (2002) 244-248, describe the use of micro-coils in the analysis of small volume biological samples. The micro-coil is formed by depositing a Cu seed layer on a Ti adhesion layer, on an oxidized Si substrate. A thick layer of photoresist is then formed on the Ti/Cu layers and patterned to form a spiral mold. Cu is then electroplated into the mold and the photoresist and Cu seed layer are subsequently removed to insulate the wires. Using a substantially similar method, C. R. Neagu et al., "Characterization of a planar microcoil for implantable microsystems," Sensors and Actuators A 62 (1997) 599-611, describe inductive coupling between an external transmitting coil and an implanted receiving planar micro-coil so as to transmit energy to the material containing the implanted coil Neagu's method for forming a micro-coil has many disadvantages, including:

(1) The thickness of the conductor is determined by the photoresist.

(2) The final micro-coil has a non-planar upper surface, which can adversely affect subsequent processing steps and integration of additional components.

C. C. Sheng et al. ("Electromagnetic optical switch for optical network communication," J. Magnet. Mater., 239, 2002, 610-613) design and fabricate an electromagnetic optical switch with NiFe (permalloy) on a vibrating suspension diaphragm and a planar micro-coil generating the magnetic force to produce the diaphragm displacement. The system was realized using many complicated fabrication processes, including electroplating, bulk micromachining, excimer laser ablation and wafer bonding. The coil does not have a magnetic core, which results in significant flux leakage.

D. J. Sadler et al. (Micromachined Semi-Encapsulated Spiral Inductors For Micro Electro Mechanical Systems (MEMS) Applications, IEEE Trans. on Magnetics, Vo. 33, No. 5, September 1997, 3319-3321) design and fabricate a semi-encapsulated spiral inductor, formed on pyrex glass that is bonded to a Si wafer. The multi-step process includes the following: (a) seed layer deposition on a substrate; (b) photolithography to form an electroplating mold using a first mask; (c) copper coil electroplating; (d) resist and seed layer removal; (e) via patterns formation using second photolithography process; (f) high temperature curing; (g) seed layer evaporation; (h) top magnetic and via patterning using third patterning process. As can be seen, this process requires several stages of photoresist and photolithography, which places stringent requirements on such factors as surface planarization.

Photoresist is also used as a patterning, insulating and planarizing material in the fabrication of planar micro-coils. Filas et al. (U.S. Pat. No. 6,495,019) teaches a process that allows the formation of a variety of integrated CMOS and micromagnetic components, particularly planar coils and transformers. The process involves forming a first patterned photoresist layer within which to electroplate a magnetic layer onto a seed layer. Next, a second patterned photoresist layer is formed as an insulating/planarizing/support layer over the magnetic layer. Finally, a conducting coil is formed by electroplating into the patterned second photoresist layer. In some specific applications, the resulting planar micro-coil was sandwiched between two layers of magnetic material, which shield the coil and restrict the magnetic field produced by the coil to the region between the layers.

The design of these types of micro-coils suffer from several limitations, the most severe being the photolithographic processes required to form high aspect-ratio electroplating molds from the photoresist layers. The photoresist insulation layer between the micro-coils must fulfill many requirements, including photostructureability, ability to support vias for interconnections between different micro-coil layers, the ability to supply sufficiently planarizable surfaces so that successive layers can be formed and precisely photolithographed and good dielectric properties (e.g. low dielectric constant and high breakdown voltage.) Finally, the micro-coils formed by the method have a size on the order of millimeters, which limits their ability to produce the desired magnetic field gradients.

Recent research has also focused on the fabrication of 3-dimensional micro-coils. For example, Chong H. Ahn et al. ("A New Toroidal-Meander Type Integrated Inductor With A Multilevel Meander Magnetic Core," IEEE Transactions on Magnetics, Vol. 30, No. 1, January 1994) forms a toroidal inductor, with a multi-level meander magnetic core (a multilevel core linking planar coils, rather coils linking a planar core) was formed on a silicon wafer using multi-level metal interconnect schemes. A complex 6-step fabrication process involves (a) polymide deposition on a Si wafer; (b) plasma etching a plating mold through the polymide using an Al mask; (c) plating a lower magnetic core into the mold; (d) deposition and patterning of a conductor about the core; (e) plating vias; (f) plating an upper core onto the lower core to form the meander. The inductor size was 4 mm×1 mm, with only 30 turns and the magnetic core material was electroplated $Ni_{81}Fe_{19}$, producing an inductance of 30 nH/mm$^2$ at 5 MHz.

Another 3-dimensional air-core micro-coil has been fabricated by using the deformation of a sacrificial thick polymer and electrodeposition. Nimit Chomnawang and Jeong-Bong Lee ("On-chip 3D air core micro-inductor for high-frequency applications using deformation of sacrificial polymer," Proc. SPIE, Vol. 4334, 2001, 54-62) describe the formation of an inductor coil by first forming patterned, electroplated planar bottom conductor pieces, then connecting the bottom conductor pieces with an upper curved conductor formed by electroplating conductor pieces on a supporting convex surface. The bell-shaped convex surface is formed by curing a positive photoresist originally deposited in a rectangular mesa formation. The deformed photoresist support core is then stripped away, leaving a completed coil with an air core. The large number of vias required to interconnect all sections of the coil dramatically increases the coil resistance, limits the magnitude of the current that can be injected and, therefore, limits the maximum magnetic flux density.

M. Babric, J. J. Mock, A. P. Gray and S. Schultz ("Scanning probe electromagnetic tweezers," Appl. Phys. Lett., 79 (12), 2001, 1897-1899) describe the fabrication of a solenoidal 3D micromagnetic manipulator wherein a 25 micron copper wire is wound around a 50 micron diameter soft-magnetic wire. The resulting solenoid was used to manipulate micro-magnetic particles. The performance of such a fabrication is limited both by the number of turns that can be wound around the magnetic core and the feasibility of integrating the fabrication to other microcomponents.

More recently, Nuytkens et al. (U.S. Pat. No. 6,696,910) fabricated a toroidal-shape inductor on a printed circuit board (PCB) composed of two dielectric layers sandwiching a ferromagnetic layer. A toroidally wound coil is formed by passing conducting leads through both dielectric layers by means of vias, so that the ferromagnetic layer becomes the core of the coil. Primary and secondary coils can also be formed in this way. The nature of the PCB may not permit the device to operate at high current densities. An additional problem arises from the fact that the ferromagnetic material forming the core is nickel that is deposited by electroplating or electroless plating. The use of various chemical agents in the nickel plating process introduces phosphorus in the final layer which can adversely affect its magnetic saturation (see, e.g. Wolfgang Riedel, "Electroless Nickel Plating," ASM International, Finishing Publications Ltd., England, 1989, pp. 104-106.

As can be seen from the above citations, there are several limitations and disadvantages to be found in prior art structures and methods which can be summarized as follows:

(1) The dimensions of the fabrications produce limited magnetic field gradients and, in consequence, limited magnetic forces.

(2) The designs are basically scaled down versions of macroscopic designs and, as such, require complicated fabrication processes.

(3) The problems associated with the complicated designs and process steps also result in uneven surfaces, which is a disadvantage when subsequent process steps are required.

(4) None of the prior art methods are able to efficiently generate high magnetic field gradients along with planarized surfaces compatible with the integration of additional circuitry and components on the same chip.

SUMMARY OF THE INVENTION

The first object of this invention is to provide an apparatus for generating, manipulating and focusing magnetic fields, magnetic field gradients and magnetic forces.

A second object of the present invention is to provide an apparatus for trapping, transporting, concentrating, mixing and sensing small magnetic particles.

A third object of the present invention is to provide an apparatus for in-vivo nuclear-magnetic-resonance (NMR) microspectroscopy analysis of small volume samples.

A fourth object of the present invention is to provide an apparatus for magnetically actuating a micro-mirror, which is a small flexible membrane reflectively coated on at least one of its sides.

A fifth object of the present invention is to provide an apparatus for actuating a variety of micro-electromagnetic systems (MEMS), such as switches, fluidic valves and micro-motors.

A sixth object of the present invention is to provide an apparatus for the manipulation of ferrofluids on a micro-fluidic scale.

A seventh object of the present invention is to provide micro-magnetic devices that can be used for the micro-self-assembly of diverse micro-components on a substrate.

An eighth object of the present invention is to provide an inductor that can be easily integrated into various forms of RF and HF communication circuitry.

A ninth object of the present invention is to provide all such apparatus in the form of planar micro-coils and arrays of such micro-coils.

A tenth object of the present invention is to provide such micro-coils and arrays of such micro-coils wherein the magnetic properties are enhanced by the addition of ferromagnetic pillars or ferromagnetic pillars and plates.

An eleventh object of the present invention is to provide a design for such micro-coils wherein field strengths and gradients can be enhanced, manipulated and controlled by a tuned current.

A twelfth object of the present invention is to provide a method of fabricating such micro-coils and arrays of micro-coils that permits integration with other circuitry and components.

A thirteenth object of the present invention is to provide a method of fabricating such micro-coils on or in a Si substrate, the high thermal conductivity of such a substrate providing a particularly effective heat dissipation and removal mechanism.

The objects of the present invention will be achieved by the formation of planar micro-coils and arrays of such coils, that are formed on or embedded in either a silicon or a dielectric polymeric substrate and are formed of conductors having a cross-sectional shape with large area and high thickness-to-width aspect ratio (typically 10/3, but 9/3, 11/3 or any aspect ratio greater than 3/1 is also acceptable), i.e., characterized by a thickness (vertical dimension) that is substantially larger than a width (horizontal dimension). The micro-coils so formed typically comprise two components, (1) a planar micro-coil formed of Cu electroplated onto or into a Si or polymeric substrate; and (2) a structure serving the purpose of a flux-concentrating magnetic core, the structure being a ferromagnetic pillar, formed by electroless plating of a highly permeable ferromagnetic material, preferably NiCoP, but not limited to that material, on the upper surface of the coil, the pillar thereby playing a field (or flux) concentrating role similar to that played by magnetic cores in macroscopic coils. In some of the embodiments there will also be a magnetic backplate formed on the backside of the micro-coil and, thereby, providing increased magnetic flux closure. It is noted that the silicon substrate is an excellent heat-sink and, further, that the dielectric polymer can offer dielectric property advantages over the silicon. In addition, the silicon can be easily planarized, enabling additional processing to be carried out efficiently and allowing additional circuitry to be integrated with the micro-coils.

The micro-coils and their arrays will be formed in accord with a number of preferred embodiments, all of whose coil shapes can be classified as either meander (covering increasing areas in what may be a random or simple repetitive manner) or spiral. Along with the various coil shapes, each embodiment is also characterized by the connectivity of its coil arrays and by additional characteristics listed below. The different geometries result in different performance characteristics and, therefore, make the various embodiments suitable for a diversity of operations. Specifically, the embodiments can be categorized as follows:

(A) planar micro-coils (spiral or meander) formed on or embedded within a silicon substrate, with or without ferromagnetic pillars;

(B) planar micro-coils (spiral or meander) embedded in dielectric polymer, with or without ferromagnetic pillars; and (C) planar micro-coils (spiral or meander) formed on or embedded within a silicon substrate, with magnetic pillars raised a substantial distance (compared to (A) and (B)) above and through the silicon and additional backside plates that contact the pillars to form substantially closed magnetic circuits.

As noted, the micro-coil cross-sections in the examples to be described will generally have an aspect ratio (thickness/width) of 10/3, although other high aspect ratios ("high" meaning greater than 3/1) such as 9/3 or 11/3 will meet the objects of the invention. These embodiments are achieved by a fabrication method based on electroplating and chemical mechanical polishing (CMP). The choice of aspect ratio values may ultimately depend upon the technology being implemented. The miniature ferromagnetic pillars are formed of ternary alloy NiCoP or other highly permeable magnetic materials and are deposited using electroless plating. The various fabrication methods will be described more fully below in the context of the descriptions of each of the preferred embodiments.

The micro-coils can be arranged in series arrays or parallel arrays, such arrays allowing adjustment of the magnetic fields and gradients by tuning the injected current. The ferromagnetic pillars, which play a field-concentrating role similar to the cores of macroscopic coils, are placed at the location of magnetic field maxima of each micro-coil. As a result, the magnetic field is focused at these specific locations and steep magnetic potential wells can be created. The micro-coils generate the magnetic fields necessary to magnetize the magnetic material forming the pillars and, because they are paths of low reluctance (highly permeable), once the pillars are magnetized, the magnetic lines of flux will be concentrated through them. Hence, the magnetic field at the location of the pillar will be of greatest magnitude and the magnetic gradient at that location will also be great because the flux diminishes rapidly in the region outside of the pillar. Thus, a deep potential well is established in the immediate vicinity of the pillar. An additional advantage offered by the arrays is that the local maxima of the magnetic field can be shifted from point to point on the device surface by properly controlling the current in the array.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENTS

The present invention, in each of its embodiments, provides a method of fabricating micro-coils and arrays of micro-coils in and on silicon substrates and embedded within dielectric polymer layers formed on the substrates (and the coils and arrays so fabricated), with and without flux-concentrating magnetic pillars and back-plates. These micro-coils and their arrays produce magnetic fields of large magnitude on the order of 0.1 T and large gradients on the order of $10^3$ T/m and are, therefore, suited for a wide range of applications that require the exertion of strong magnetic forces at small distances. In this sense, the micro-coils are micro-electromagnets. In addition, the micro-coils are micro-inductors and micro-receivers and micro-transmitters of electromagnetic energy. The descriptions given below will first describe the geometric designs of the embodiments, with reference to FIGS. 1a-j and FIG. 2. A second section will then describe the method of fabrication of the embodiments, with reference to FIGS. 3a-j, FIGS. 4a &b, FIGS. 5a-o, FIGS. 6a-g and FIGS. 7a-l.

Description of the Micro-Coil Designs and Properties.

The coil designs to be discussed below are all advantageously adapted to meeting the objects of the invention. It is also to be noted that each design may be implemented with or without a flux concentrating magnetic pillar and with or without a connected back-plate for increasing closure of the magnetic circuit.

Figure 1A:
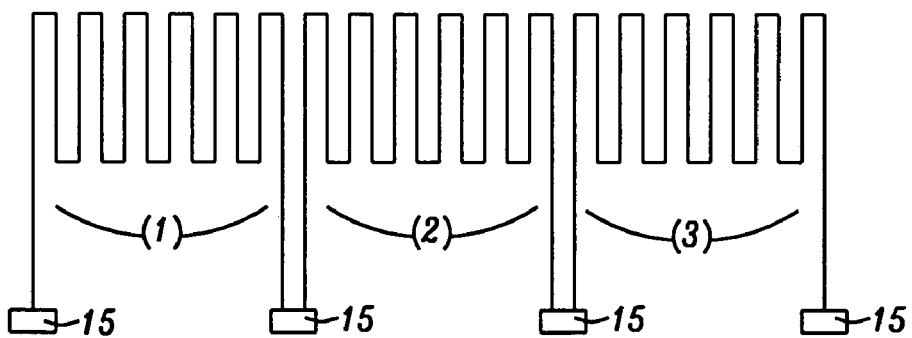
FIGS. 1a-j are schematic illustrations of meander and spiral shaped coils and arrays of such coils corresponding to different embodiments of the invention.

Referring first to FIG. 1a (coil M1), there is shown a 3-phase meander type coil (1), (2) and (3), array denoted M1. In this design the conductor in each of the three individual coils is looped back and forth to create a series of parallel adjacent conductor segments through which the current flows in alternating (i.e., in relatively opposite) directions. An array of an arbitrary number of coils of this type is constructed by electrically connecting the individual coils in series (i.e., directly connecting one coil to the next), as is the case for the 3 coils in this figure. Since the current in this coil configuration flows in relatively opposite directions in adjacent coil segments, according to Ampere's law the z-component (component orthogonal to the figure plane) of the magnetic field results from the summation of the separate z-components of the fields produced by each segment. This coil design is particularly well suited to the manipulation and characterization of micro and nano sized objects. Not only does the design offer the well defined, strong and localized magnetic forces that are effective in trapping small magnetic particles, but it is well suited for integration with other micro-electronic circuitry for the construction of compact, self-contained microanalysis systems. Outer bonding pads, (15) both connect the coils and allow external connections to the coils. Certain of the figures will indicate two types of bonding pads, larger outer bonding pads (15) which are connected to the outermost ends of the micro-coil and used to make connections to other devices and circuitry and smaller inner bonding pads (18) that are connected to ends of a micro-coil that are within the periphery of the micro-coil. Inner bonding pads are typically connected to outer bonding pads by means of bridging leads (17), which needn't be formed of the same conductor material as the micro-coils themselves.

Figure 1B:
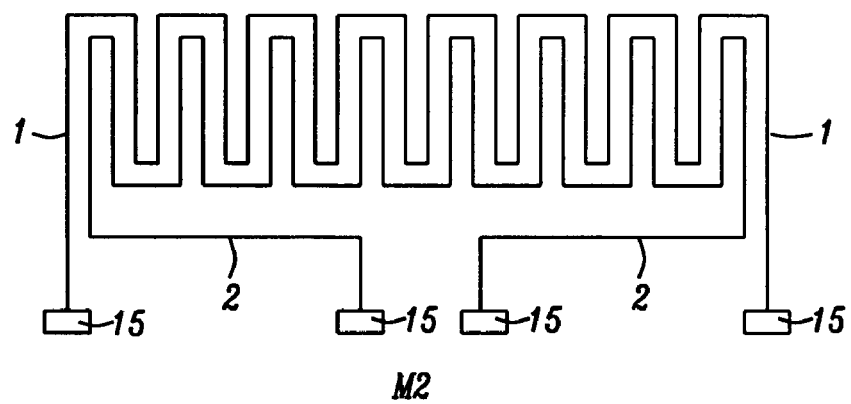

Referring next to FIG. 1b (coil M2), there is shown an interdigitated form of the meander coils of FIG. 1a. In this device, two meander micro-coils (1) and (2) are placed so that the coil segments of one coil are interwoven with those of another coil. The micro-coils are neither electrically connected nor physically in contact with each other. Each micro-coil has alternating narrowly spaced and widely spaced loops, with the narrow loop of one micro-coil fitting within the wider loop of the other micro-coil and vice-versa. The current directions in the two loops can be the same or opposite, but the two currents are independent of each other. Different values of the magnetic field can be easily generated by varying the magnitude and/or direction of the currents or even reducing one current to zero. This micro-coil design shares the properties of micro-coil M1 that make it particularly suitable for small particle trapping and analysis. Outer bonding pads (15) allow external connections to the micro-coils.

Figure 1C:
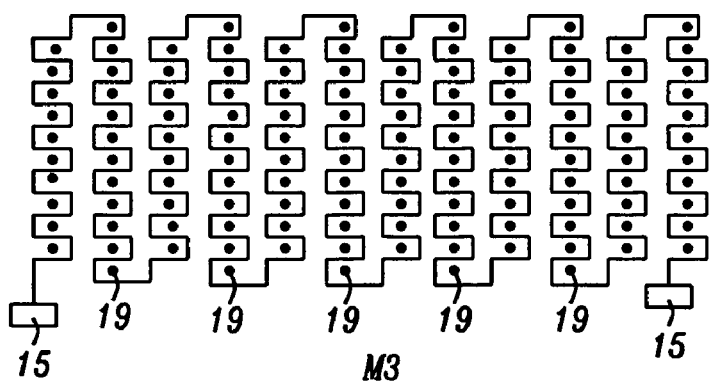
Figure 1D:
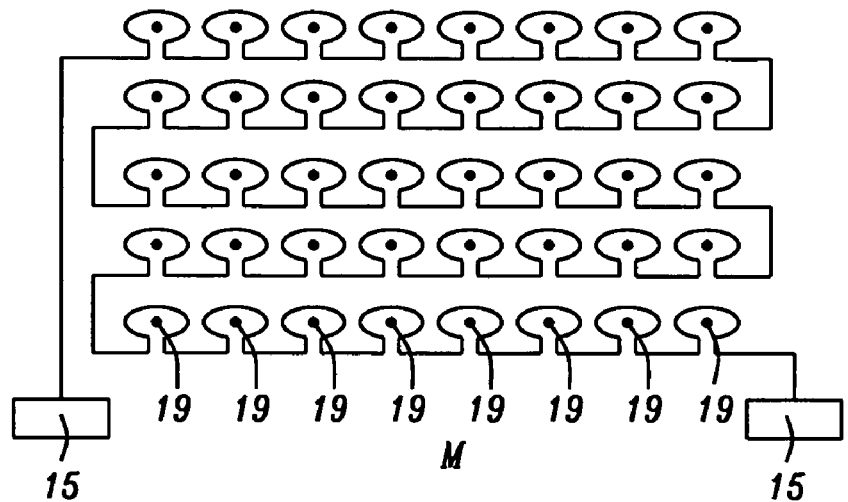

Referring next to FIGS. 1c (coil M3) and 1d (coil M4), there are shown two meander type micro-coils, each having magnetic pillars (shown in all figures as "dots") located at loop centers. Micro-coil M3 consists of small rectangular shaped loops formed within larger meandering loops while micro-coil M4 consists of small substantially closed circular loops formed within larger meandering loops. Each row in micro-coil M3 consists of $N_1$ loops and the entire structure contains $N_R$ rows, through which the current flows in opposite directions as in M1. A ferromagnetic pillar (19) of NiCoP of high relative magnetic permeability, $\mu_r$, is positioned at the center of each loop and shown schematically as a "dot.". In this configuration, the magnetic field intensity and gradient are equally focused at the tip of each pillar, resulting in islands of high magnetic field and gradient being uniformly distributed over the micro-coil surface.

Micro-coil M4 is constructed as an array of substantially circular loops joined to each other. Each row of the configuration consists of $N_L$ loops and the entire structure contains $N_R$ rows, through which the current flows in opposite (alternating) directions. Similarly to micro-coil M3, a ferromagnetic pillar (19) of NiCoP, or other material of high relative magnetic permeability, $\mu_r$, is positioned at the center of each loop. In this configuration, the magnetic field intensity and gradient are equally focused at the tip of each pillar, resulting in islands of high magnetic field and gradient being uniformly distributed over the micro-coil surface. The essential difference between micro-coils M3 and M4 is that the circular shape of the loop surrounding the pillar in coil M4 produces a larger overall magnetization of the pillar. Outer bonding pads (15) allow external connections to the micro-coils.

Both M3 and M4 are effective in meeting all the objects of the invention, including, for example, trapping small particles and guiding them towards the positions of high field gradient at the magnetic pillars. Thus, if the coils are so used, the small particles will be found localized around the positions of the pillars where they can be analyzed as desired.

Figure 1E:
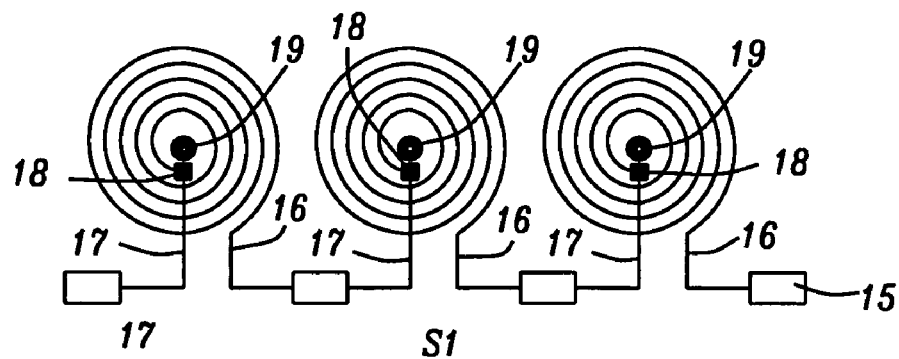
Figure 1F:
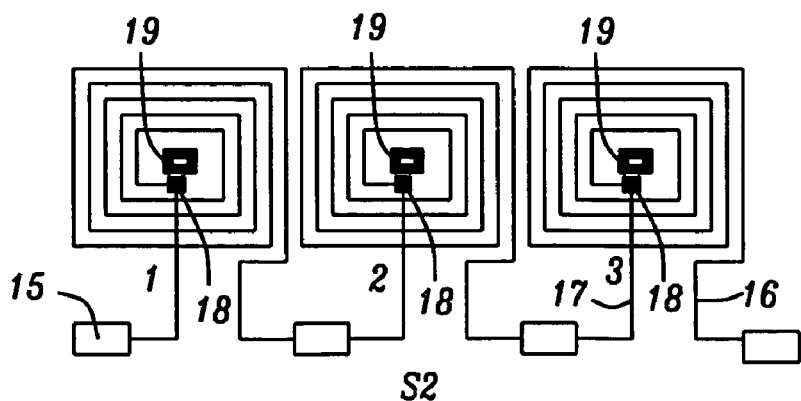

Referring next to FIGS. 1e and 1f, there is shown, respectively, micro-coils S1 and S2. These micro-coils are both spiral type coils, connected electrically in series and having ferromagnetic pillars (19) at their centers. Both S1 and S2 consist of three micro-coils, (1), (2) and (3), connected in series, but any number of such coils can be so connected. The number of coils so connected affects the phase of the current as it passes through each coil. The phase differences allow the magnetic field to be manipulated and to have the point of maximum field shift in position. A difference between S1 and S2 is that the spiral windings of S1 are substantially circular, whereas those of S2 are substantially square. A very steep magnetic field gradient is formed at the tip of each pillar and the current flowing through the array can be programmed so that the magnetic field can be shifted from one coil to another, which is useful when using the micro-coils to guide magnetic particles from place to place. Both S1 and S2 are particularly well suited to trapping small particles around the deep potential wells at the ferromagnetic pillars and then transporting the trapped particles (linear transport) from one spiral micro-coil to another by programming the current in the coils. Electrical connections to these micro-coils are made at outer bonding pads (15) which are connected by leads (16) to outer ends of the coil. Inner bonding pads (18) are connected to outer bonding pads by bridging leads (17).

Figure 1G:
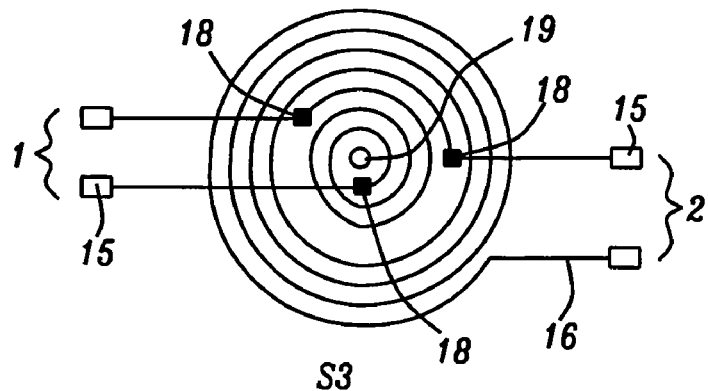

Referring next to FIG. 1g, there is shown micro-coil S3, which consists of two circular, independent, spirally wound micro-coils (1) and (2) that have a centrally positioned ferromagnetic pillar (19). One of the two micro-coils (the inner coil) is smaller than the other and is centrally positioned within the inner circular periphery of the larger micro-coil (the outer micro-coil). By alternatively switching the currents in each of the two coils, so that the current is ON in one micro-coil and OFF in the other and vice versa, different magnetic field magnitudes can be obtained at the pillar. This particular design is particularly suited to transporting micro-particles radially by programming the currents in the outer and inner coils. Bonding pads (15) allow external connections to the coils. Bridging leads from outer bonding pads (15) to interior bonding pads (18) are shown as (17) and leads from outer bonding pads to outer coil ends are shown as (16).

Figure 1H:
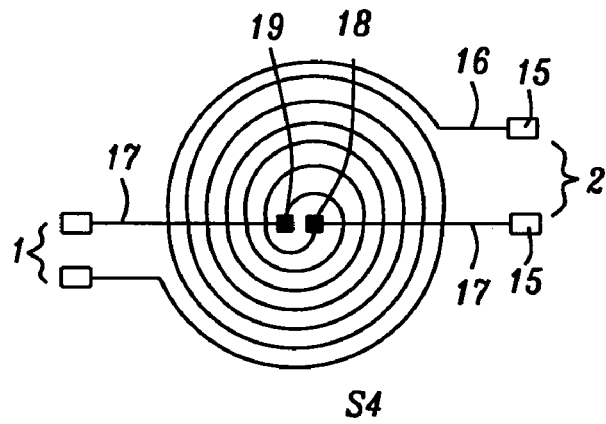
Figure 1I:
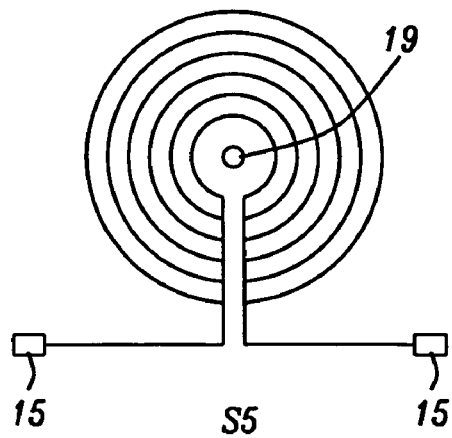

Referring next to FIG. 1h, there is shown micro-coil S4, a design in which two independent circular, spirally wound micro-coils (1) and (2) are interlaced, with their wires being parallel to each other in a manner similar to the interdigitated micro-coil M2. The injected currents can be separately set as on/off, parallel/antiparallel and can be of the same or of different magnitude. When the currents are injected alternatively between the two spirals, the maximum value of the magnetic field can be shifted spatially from one position to another. Bonding pads (15) allow external connections to the micro-coils.

Referring next to Fig. In, there is shown coil S5 a semi-spiral micro-coil, which consists of an array of open circular conducting segments of decreasing radii, connected in parallel by radially directed conducting segments that contact the ends of the circular segments. A ferromagnetic pillar is positioned at the center of the array. This configuration provides a current gradient through the separate micro-coil segments due to their decreasing total length and resistance, together with the field gradient provided by the pillar. Thus, there is an enhancement of the field gradient as compared to micro-coil designs in which the current is substantially constant through the micro-coil element.

Figure 1J:
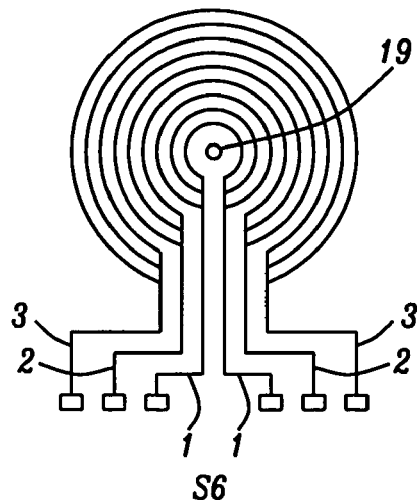

Referring next to FIG. 1j, there is shown micro-coil S6 an array of three semi-spiral micro-coils, labeled (1), (2) and (3) at their bonding pads, of type S5, each semi-spiral being concentric with the others and with a centrally positioned ferromagnetic pillar and each semi-spiral having an independent current injected therein. The figure shows these three independent semi-coils (3 phases) wound about a common central axis and pillar (19). This coil configuration, within its general applicability, is particularly well suited to radially transporting trapped particles towards the central pillar location. As noted above, the varying circumferential lengths of the micro-coils result in the inner micro-coils having smaller resistance than the outer coils and, therefore, having less current for a given applied voltage. If the length of coil n is denoted as $l_n$ and the current in that coil is denoted $I_n$, then the following relationship holds:

$$I_n = \frac{l_{n+1}}{l_n} I_{n+1}$$

The micro-coils described above with reference to FIGS. 1a-j are well suited for use in the following important application areas of science and technology: fluid mixing, magnetic sensing, nuclear magnetic resonance (NMR), micro-mirrors, RF coils and actuation. Mixing fluids at the micro-volume scale is not nearly as simple as at the macro-volume scale. At very small dimensions, the Reynolds number of a fluid is usually quite small and, therefore, no turbulence occurs. As a result, streams of fluid do not interfere with each other and the mixing of fluid streams does not occur to an appreciable extent. The only substantial cause of mixing is diffusion. The micro-coil configurations described above offer a good alternative to fluid mixing by the use of small magnetic particles to stir liquids. Small magnetic particles can be rapidly moved from side-to-side by alternatively switching the current in the micro-coil configurations either on and off or by reversing current directions. Coils M2, S4 and S6 are particularly effective for moving particles over small distances, while coils S1, S2 and S3 are effective in moving particles for larger distances.

The micro-coils described herein can be used as sensors that detect either changes in external magnetic fields or changes in inductance. For example, the micro-coils used for trapping magnetic particles can also be used to detect the changes in their inductance that results from the quantity of magnetic particles trapped on their surfaces.

In the area of NMR, recent activity has been directed at in-vivo microspectroscopy and, particularly, at the analysis of small volume biological samples. To achieve progress in this area, there must be a large reduction in the size of NMR RF detection coils. The coils described herein are well suited for these uses because of their small size and because they can be fabricated by means of standard integrated circuit (IC) process steps. The ease of their fabrication makes them particularly attractive for integration with other electronic components.

As has already been discussed, the nature of the planar surfaces of these micro-coils and their CMOS-compatible fabrication enables these coils to be easily integrated into various communications circuits for HF and RF applications.

The micro-coils described above can also be used as actuators, exerting strong and localized magnetic forces on various microsystems. Micro-mirrors are an important example of a type of system that requires the exertion of such localized forces. The micro-coils can exert forces on micro-magnets fabricated on the back surfaces of reflectively coated flexible membranes, thereby changing the shape and optical properties of these systems. Other systems that require the exertion of strong, localized forces are switches, fluidic valves and micromotors.

Yet another application of the micro-coil assemblies of the present invention is micro-self-assembly. In this process, multiple and diverse micro-components individually fabricated from various materials, including but not limited to III-V type semiconductor materials, can be assembled on a large substrate. The components to be assembled can be coated with magnetic material and micro-coils can be positioned at various receptor sites on the substrate. The coils at these receptor sites, when energized by currents, provide magnetic potential wells and associated magnetic binding energy to both trap the components at proper positions on the substrate and to guide the components to those positions. If necessary, additional micro-coils can be positioned along paths that facilitate the guidance of the micro-components to the positions of the trapping micro-coils located at the receptor sites. Once the micro-components are held in place by the micro-coil generated magnetic fields, they can be more permanently affixed to the substrate by various bonding techniques known in the art. The micro-coils can be positioned on the substrate or formed within the substrate. A plurality of identical substrates, for example, can be provided with a fixed array of micro-coils and, when the micro-components have been guided, held in place and affixed, each substrate can be removed and a new substrate put in place for a repetition of the process. The process of assembly, which is qualitatively similar to the process of magnetic particle trapping briefly described above, can be carried out in a fluid environment to reduce local surface interaction effects.

Description of the Micro-Coil Fabrication Process.

The conductors of all of the micro-coils are fabricated with a cross-section of high aspect ratio, namely 10/3, but the ratio can be higher than this value such as 10/2, 15/3 and 20/3, with a value greater than 3/1 being preferred. The desired aspect-ratio of this invention is obtained by forming the coils with a thickness, d, (depth into the substrate) of 10 microns and a width, w, of 3 microns, producing a cross-section area of 30 square microns. The spacing, s, between turns in all coil configurations is 3 microns. Thus, in all the particular examples illustrated below, d=10 microns, w=3 microns and s=3 microns. In general, however, d and w can vary, as long as their ratio d/w preferably exceeds 3/1. This geometry is not only suitable for the fabrication process to be described, but also produces a high magnetic field gradient along the upper side of the coil, which is the side of narrow width. The uniformity of the d, w and s dimensions applied in the examples below also simplifies the process steps and enhances the uniformity of the surface and of the copper plating during the deposition process.

Figure 2:
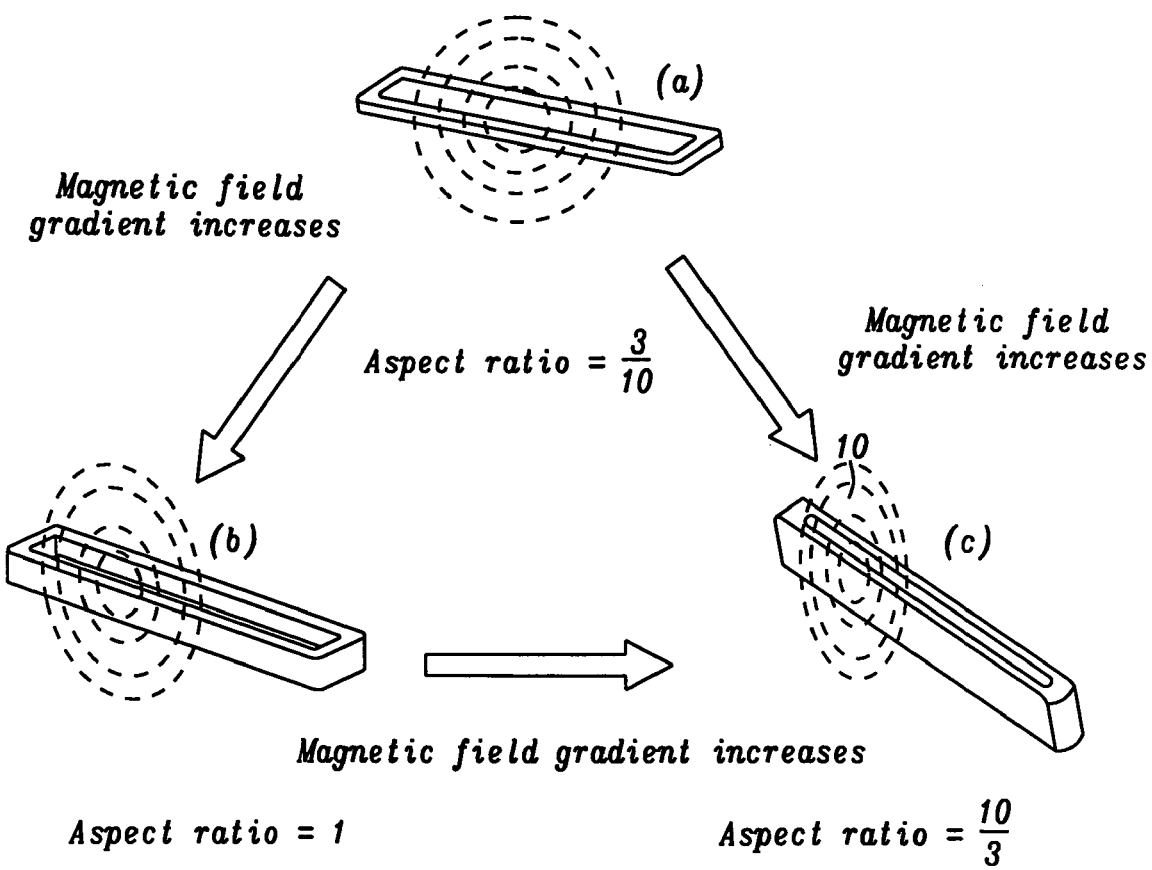
FIG. 2 is a schematic illustration of simulated magnetic field lines surrounding loops of conductors having cross-sections characterized by different aspect ratios, including the 10/3 aspect ratio that is particularly appropriate for the present invention.

Referring to FIG. 2, there is shown a schematic illustration of representative magnetic field lines that are produced by a single loop of conductor of three different aspect ratios: (a) 3/10, (b) 1 and (c) 10/3. As can be seen, the high aspect-ratio of loop (c), which is the aspect ratio chosen for the examples illustrating the invention, produces the most sharply curved field lines (10) and largest field gradient along the narrow upper surface of the loop.

Three versions of the preferred fabrication process are provided, version 1 corresponding to coils formed with or without a ferromagnetic pillar, version 2 corresponding to coils with a ferromagnetic pillar formed within a thick dielectric layer and version 3 corresponding to coils with both a pillar and a back-plate. For simplicity and ease of visualization the figures will schematically depict a single micro-coil element and a single pillar formed thereon.

Figure 3A:
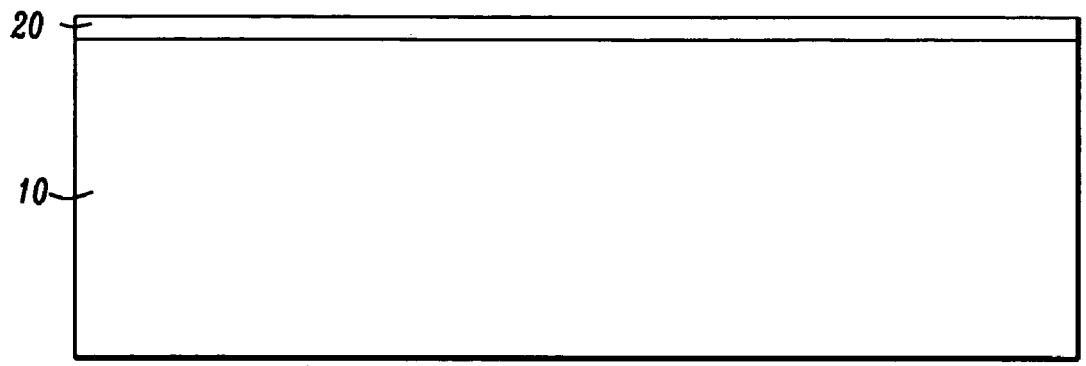
FIGS. 3a-j are schematic illustrations of the processing steps required to form a micro-coil of the present invention.

Version 1:

Referring first to FIG. 3a, there is shown a silicon wafer substrate (10) having an upper surface oxide layer (20) formed thereon (also referred to as a first oxide layer). Note, that the wafer may also have a lower (second) oxide layer formed on its lower surface, and either oxide layer may have a nitride layer formed on it for use in future patterning processes. In this particular embodiment, however, only an upper (first) oxide layer, without a nitride layer, is considered.

Figure 3B:
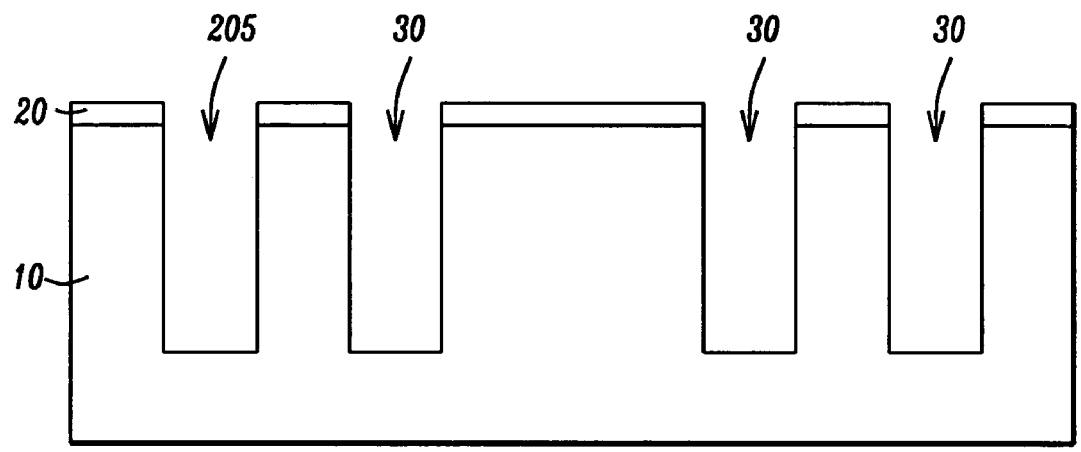

Referring next to FIG. 3b, there is shown the wafer of FIG. 3a now being patterned in preparation for the deposition of the micro-coil conductor and for a the formation of a conducting mesh for inner and outer bonding pads that will be used to form electrical connections to the finished micro-coil. A complete description of these bonding pads is given below in conjunction with FIGS. 4a and 4b. The micro-coil pattern is produced by forming a micro-coil trench (30) (or trenches, if multiple coils are to be formed) through the Si surface oxide layer and into the Si substrate using DRIE (deep reactive ion etch) as the etching mechanism. In this and all other embodiments it is understood that the micro-coil trenches are linear (although they may be curved), they have at least two ends, they have side and bottom surfaces and they have an aspect ratio that is defined as d/w, the ratio of trench depth, d, (which is uniform along the trench) to trench width, w (which is uniform along the trench). Because the figure is a vertical cross-section, the continuous linear trench appears as disconnected segments (30). At each end of the micro-coil trench and also at positions peripheral to the trench, there is formed a grid of separate trenches (see FIG. 4a for an overhead view of the grid, filled with Cu to form a mesh), shown here, for simplicity, as a single trench (205). The single trench (205) is understood not to be one of the cross-sectional segments (30) of the linear micro-coil trench, but to be a simple representation of a grid of orthogonal, horizontally intersecting short linear vertical (in depth) trenches used to form a conductor-filled mesh for bonding pads, such as shown in FIGS. 4a and 4b. The intersections of these short trenches form a grid of trenches which are filled with plated conductor to form a conducting mesh. Each of the grid of short trenches that intersect to form the mesh ((210) in FIG. 4a) has the same width, w, and depth, d, of the micro-coil trench, but its length depends on the desired cross-sectional surface area of the bonding pad. As is shown in FIG. 4a, there are both outer bonding pads (15) and (150), inner bonding pads (18) and minor outer bonding pads (180). The outer bonding pads, typically used to make connections to external circuitry, are on the order of 200 microns by 200 microns, while the inner pads (and minor outer pads), typically used to connect inner coil ends by bridging leads to outer bonding pads, are substantially smaller, being on the order of 30 microns by 30 microns. Thus, to form the conducting mesh for an outer bonding pad, each of the intersecting trenches would be approximately 200 microns in length, while the trenches for inner bonding pads need only be approximately 30 microns in length. These trenches will be filled with a conductor during the fill of the micro-coil trench, to form a mesh and the mesh will then (see FIG. 3f) be covered by a conducting layer (not formed of the same conductor as fills the trench) that contacts the end of the formed micro-coil to form a bonding pad. Note that in this and other processing steps, many etchants can be appropriately used to form the trenches, such as TMAH, KOH, NaOH, HNA, RIE or plasma etching. The trenches, in this exemplary embodiment, have an aspect ratio of 10/3, which will also correspond to the preferred dimensions of the conducting micro-coil to be formed therein. But it is to be understood that 10/3 is only exemplary and any aspect ratio exceeding 3/1 is acceptable for meeting the objects of the invention. Further, in this and all other preferred embodiments where the 10/3 aspect ratio is chosen, the trenches will be formed with a width, w, of 3 microns, a depth, d, of 10 microns and, when portions of the trench are adjacent to each other, a separation of 3 microns. The geometrical pattern of the trenches includes patterns that will form the particular coil designs, as described in FIGS. 1a-j, that are being fabricated. As noted above, and explained in greater detail in connection with FIG. 4a and FIG. 4b, an additional mesh pattern of trenches is formed at the ends of the micro-coil trench, which mesh pattern will subsequently be filled with Cu and covered by a conducting bilayer to become a conducting bonding pad. In this and subsequent figures, the grid of trenches at the end of the micro-coil trench is indicated as a single trench (205).

Figure 3C:
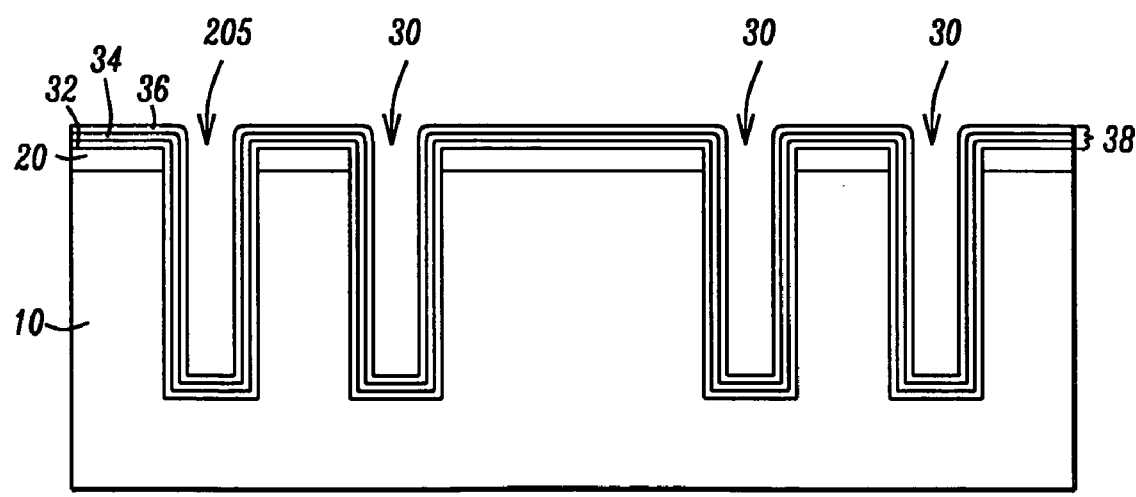

Referring next to FIG. 3c, there is shown the trenches (30) and (205) of FIG. 3b and upper substrate surface oxide (20) subsequent to the sequential formation of a tri-layer composed of an insulating oxide (32) formed by a method such as thermal oxidation to a thickness between approximately 500 angstroms and 4000 angstroms, a Ti/TiN barrier layer (34) formed by a method such as sputtering over the oxide to a thickness between approximately 200/200 angstroms and 2000/2000 angstroms and a Cu seed layer (36) formed by a similar deposition method over the barrier layer to a thickness between approximately 500 angstroms and 2000 angstroms. The three layers conformally cover the exposed side and bottom trench surfaces of the micro-coil trench and the bonding pad mesh pattern of trenches and upper oxide surface. These three layers are required to allow a high quality plating deposition of Cu coils within the trenches.

Figure 3D:
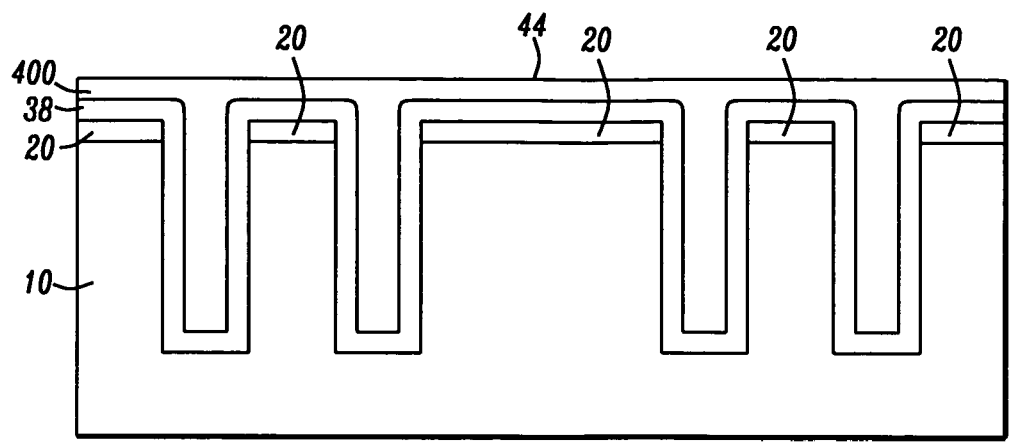

Referring next to FIG. 3d, there is shown the deposition of a conducting Cu layer (400) covering the substrate surface and conformally filling the trenches in a void-free manner. The layer is deposited by an electroplating process that is well known in the art and will not be described in further detail herein. For clarity in the figure (and subsequent figures), the entire tri-layer deposition, denoted (32), (34) and (36) in FIG. 3c is now denoted collectively as composite tri-layer (38) and the three layers will no longer be differentiated.

Figure 3E:
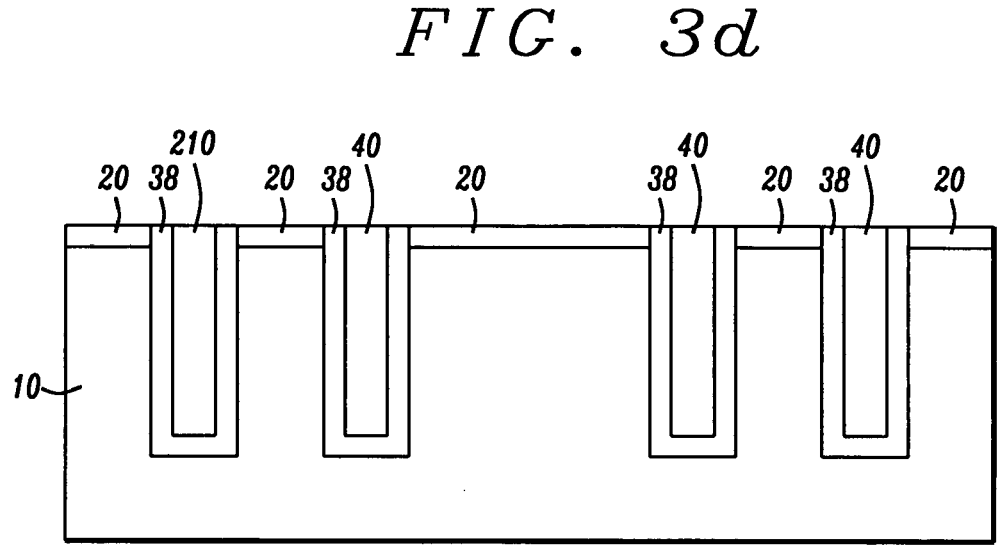

Referring next to FIG. 3e, there is shown the fabrication subsequent to a chemical mechanical polishing (CMP) of the upper substrate surface to remove excess electroplated Cu layer ((400) in FIG. 3d) as well as composite layer (38) from the upper substrate oxidized surfaces and leave the Cu, now denoted (40) where it remains in the micro-coil trench and denoted (210) where it remains in the array trench, surrounded by layer (38). The CMP also planarizes the upper surface of oxide layer (20). It is to be noted that Cu has a resistivity of 1.72 µΩcm (micro-ohm centimeter), approximately ⅔ that of pure Al, but more importantly, it has an electromigration lifetime of up to two orders of magnitude greater than Al. In addition, Cu is widely used in VLSI integrated circuit fabrication using copper damascene or dual damascene metallization processing. These properties make Cu an advantageous material for use in forming the micro-coils of the present invention.

Figure 3F:
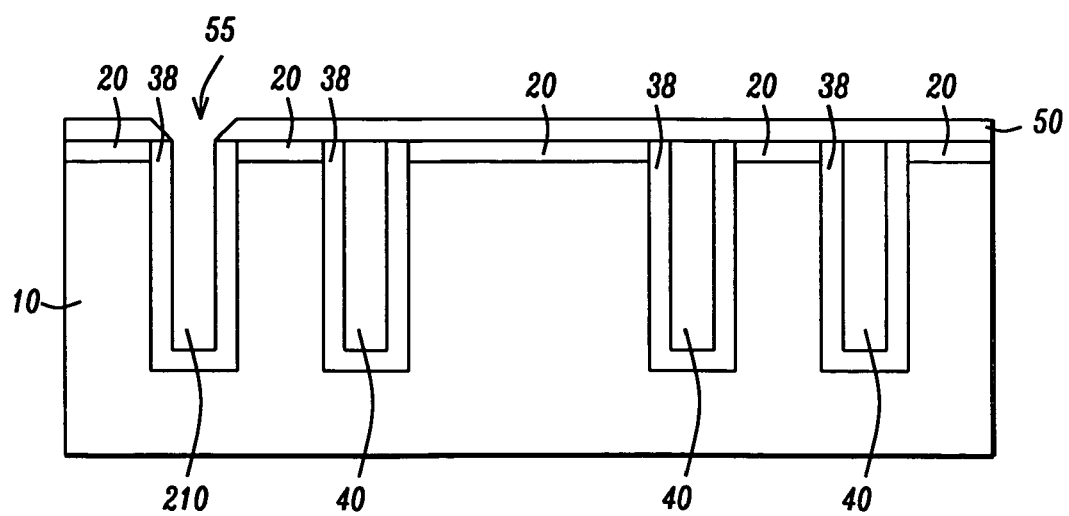
Figure 4A:
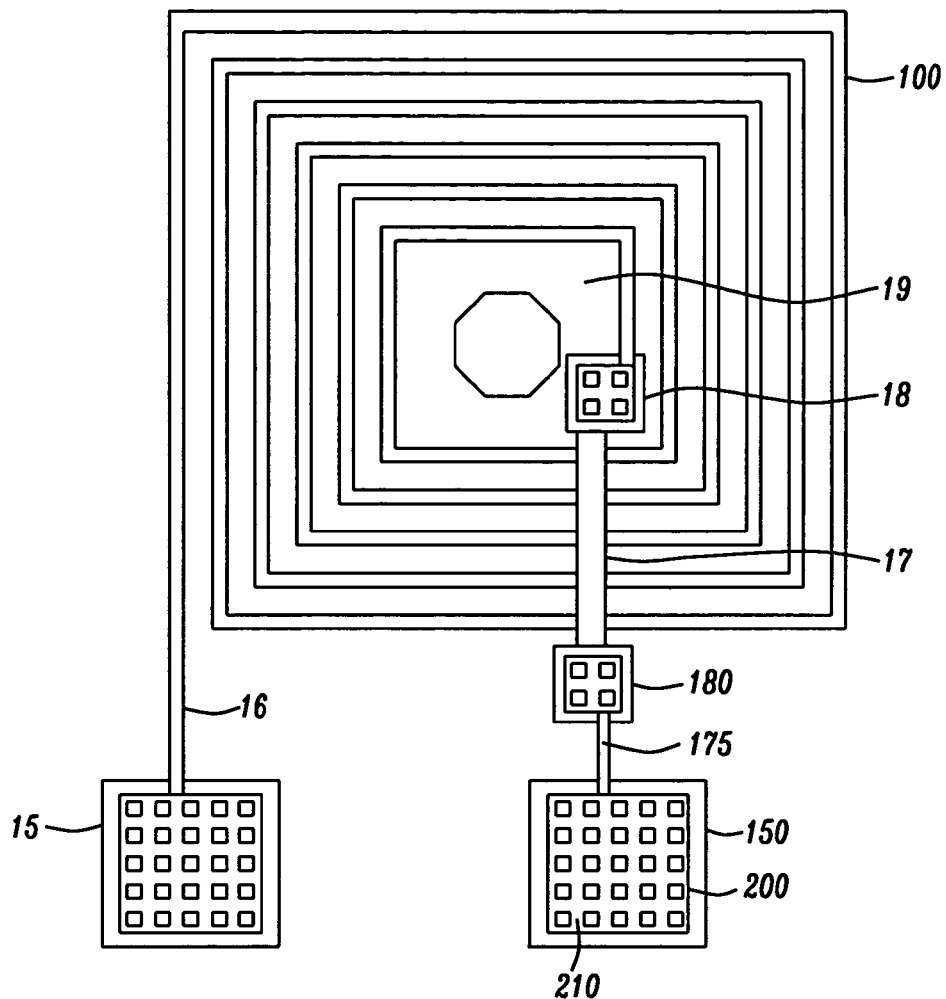
FIG. 4a is a schematic overhead drawing of a single square spiral micro-coil, showing the bonding pads and leads through which current is injected.
Figure 4B:
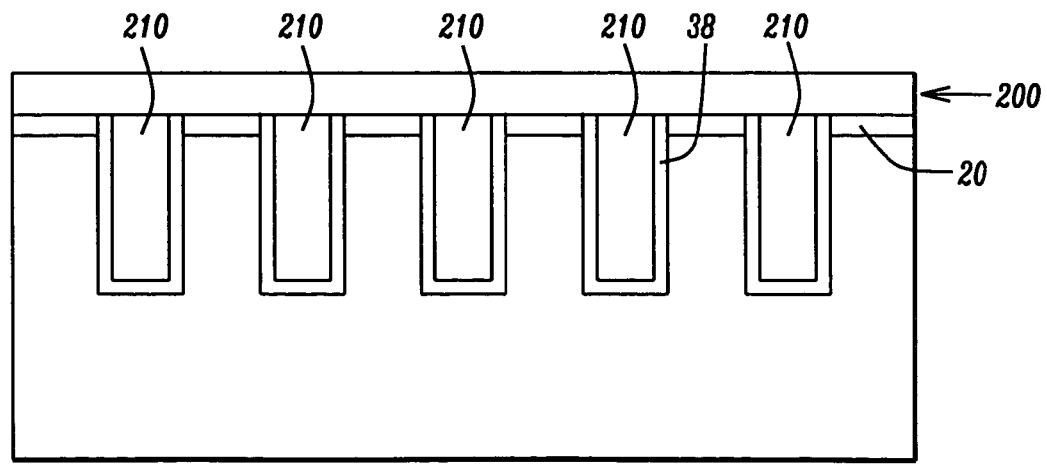
FIG. 4b is a schematic cross-sectional magnified view of a bonding pad.

Referring next to FIG. 3f, there is shown the fabrication of FIG. 3e with the subsequent formation of an approximately 1000 angstrom thick oxide passivation layer (50) over the oxide layer (20) surface. Windows (openings) (55) are patterned and opened in the passivation layer to allow the subsequent formation of a conducting layer on the Cu bonding pad mesh (210). A plasma etch of the exposed Cu coil at the position of the via window (55) is required to remove any CuO formed on the Cu during the processing that could interfere with subsequent electrical connections to the Cu mesh through the via opening.

Figure 3G:
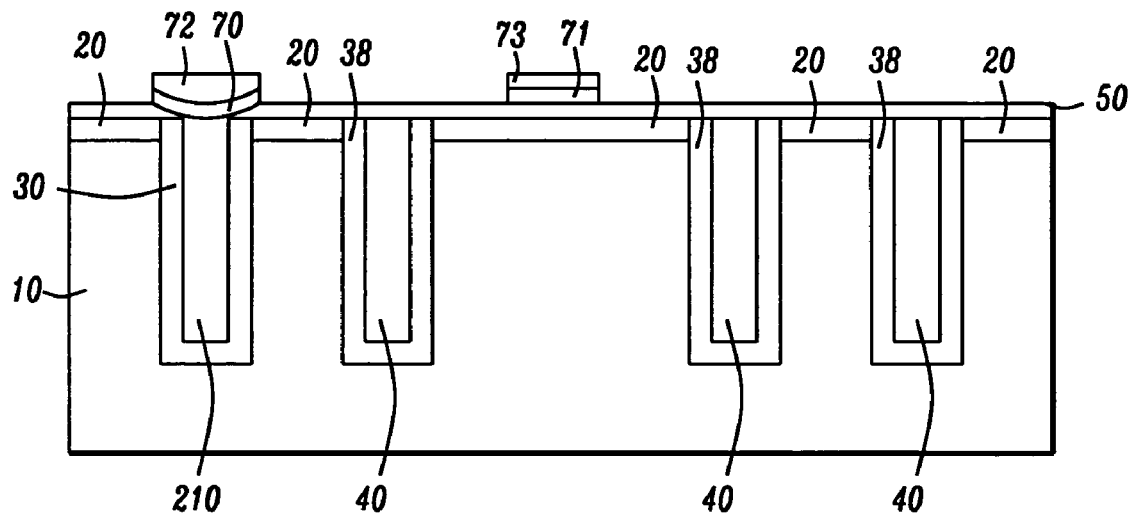

Referring next to FIG. 3g, there is shown the fabrication of FIG. 3f with an additional subsequent deposition of a patterned conducting bilayer, which is an approximately 250 angstrom thick patterned Ti barrier layer (70) and (71), but which can be formed with a thickness between approximately 200 and 2000 angstroms followed by a deposition over that barrier layer of an approximately 1 micron thick Al layer (72) and (73), which can be formed with a thickness between approximately 0.5 micron and 3 micron. The Ti/Al bilayer thereby formed covers the Cu filled bonding pad mesh (210) and completes the bonding pad formation as discussed below with reference to FIGS. 4a and 4b. It should be understood that the use of Al in subsequent steps has been found to meet the objects of the invention, but other metals, such as Cu, Au or Ni could also be used. Here, the Al layer is used to form leads from an outer micro-coil end to a bonding pad (shown as (170) in FIG. 4a), conducting bridges between the interior end of a spiral micro-coil and peripheral bonding pads (shown as (17) in FIG. 4a) and is formed as a Ti/Al bilayer over the Cu mesh (shown as 220 in FIGS. 4a &b), to complete the bonding pads themselves. These structures are also indicated in FIGS. 1a, e, f and h as (15) for the bonding pads and (17) for the bridges. In this figure, (70) and (72) schematically represent Ti/Al (i.e. Al on Ti) over the Cu mesh on each end of the Cu micro-coil winding, the layers having the thicknesses noted above. The formation of these bonding pads will be discussed more fully with reference to FIG. 4b below. It is further noted that such bonding pads and pillar substrates will be used in subsequent embodiments and will have the same thicknesses therein. It is understood that certain micro-coil shapes will have a plurality of ends and certain micro-coil shapes, particularly spirals, will have interior (to the outer coil periphery) ends and exterior ends. In such cases, outer bonding pads must be formed exterior to the coil periphery so that connections to the micro-coil do not cross over the coil windings and possibly short-circuit them. The Al (in the form of an Al on Ti bilayer) is used to form the bonding pads (shown in greater detail in FIG. 4a and described in FIG. 4b), and it also forms leads, called bridging leads, to the minor outer bonding pads from the interior inner bonding pads. In addition, the Al (or other metal) layer (as a Ti/Al bilayer) is also used as a substrate (or base), (73) on (71), for a subsequent ferromagnetic pillar deposition, as will be shown in greater detail in FIGS. 3h-j and FIGS. 4a and b. The use of Al (as an Al on Ti bilayer, denoted Ti/Al) as a substrate or base for the formation of a ferromagnetic pillar is particularly advantageous because Al acts as a catalyst for the electroless deposition of nickel and, therefore, it allows the selective plating of the pillars, which contain nickel. The horizontal dimensions of the Al substrate for the pillar deposition in these examples ranges from approximately 10 microns to 90 microns, with horizontal cross-sectional shapes that are circular, square or octagonal. It is to be noted that other substrate dimensions may be used, depending upon the final size of the pillar.

Figure 3H:
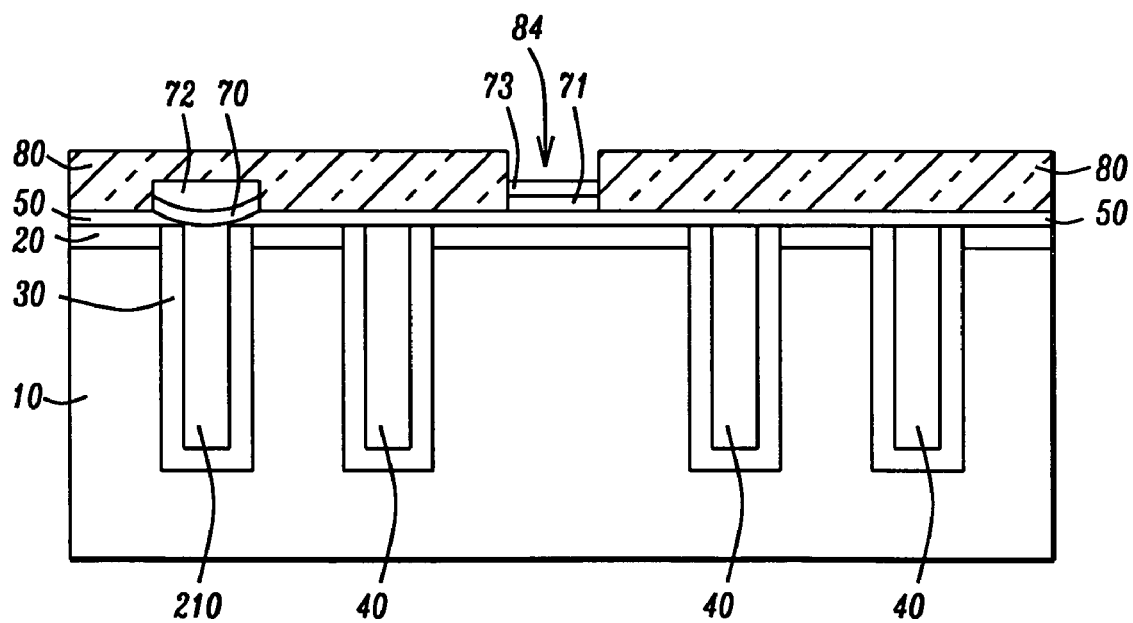

Referring next to FIG. 3h, there is shown the fabrication of FIG. 3g with a subsequent coating of a dielectric layer (80). This layer, which is a dielectric material such as benzocyclobutene (hereinafter referred to as BCB), serves to protect the other portions of the surface from electroless plating of a ferromagnetic pillar, since the plating is desired only on the Al base (73). This BCB layer is thin, between approximately 2 and 5 microns, and is patterned to produce an opening (84) over the Al substrate (73) onto which the pillar will be plated. The plated magnetic material of the pillar will grow initially within this shallow opening and will then continue to grow above the layer (80) for the desired total length of approximately 50 microns, to form a mushroom like structure as illustrated in the following FIG. 3i. It is noted at this point that the process steps schematically illustrated in FIGS. 3a-3g can be used to form a micro-coil without a ferromagnetic pillar, which also an embodiment of the invention, in which case the Ti/Al deposition (71) and (73) of the pillar substrate would be omitted along with the pillar deposition steps now to be described.

Figure 3I:
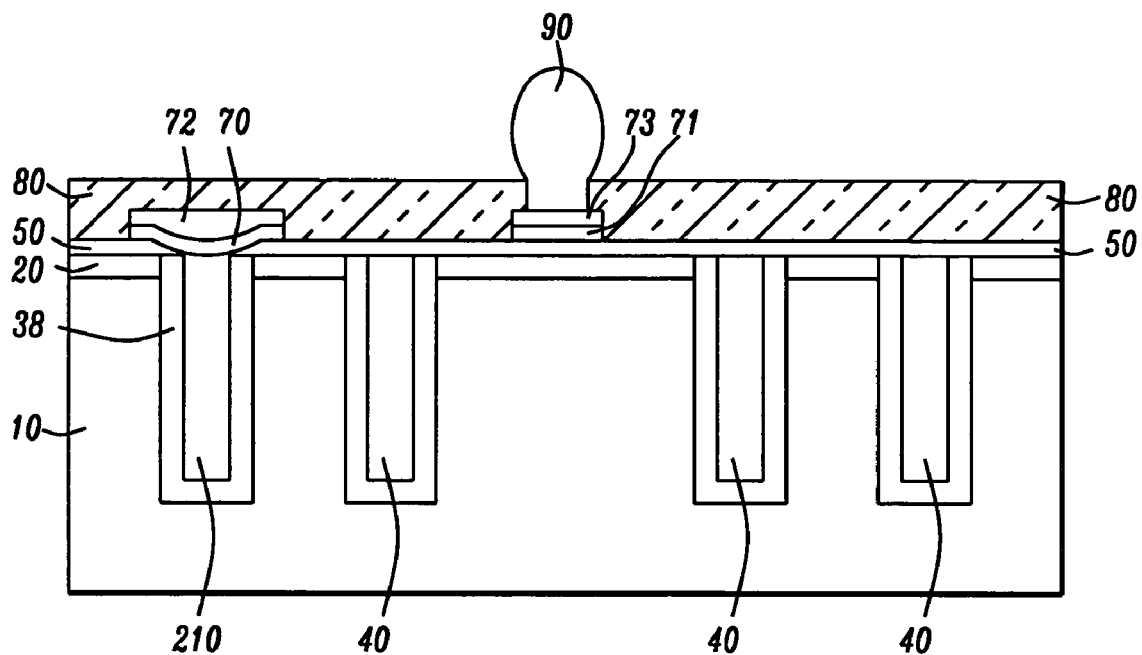

Referring next to FIG. 3i, there is shown the formation, by electroless plating, of a NiCoP pillar (90) onto the Ti/Al substrate (71) and (73) as discussed above. This pillar, which can also be formed of other, highly permeable ferromagnetic materials, is plated to a height between approximately 10 and 50 microns in these examples, with a small portion being within the BCB layer (80) and the remaining portion extending above the layer. It is to be noted that pillar heights smaller than 10 microns and greater than 50 microns are also suitable for meeting the objects of the invention, the dimensional choice depending upon the application and coil design. The method of electroless plating is well known in the art and is not described herein in detail.

Figure 3J:
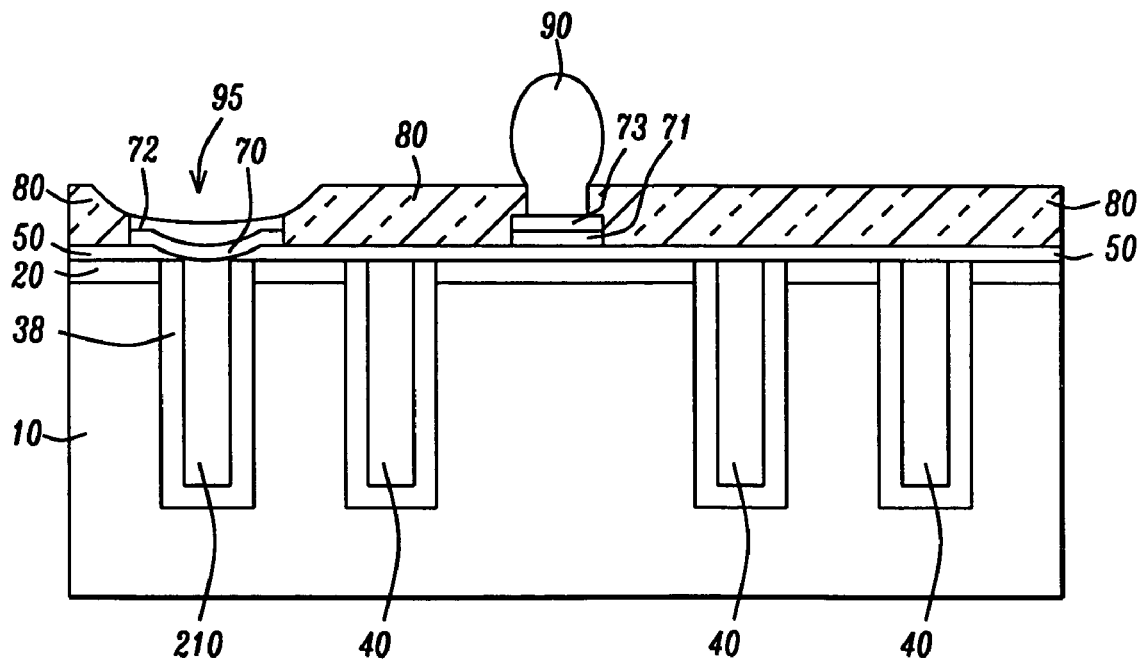

Referring next to FIG. 3j, there is shown the fabrication of FIG. 3i with the additional patterning of an opening (95) over the Ti/Al bonding pad base (70) and (72). An Al lead or leads (not shown), or bridging lead or leads (not shown) have previously been formed as shown in FIG. 3g along with the formation of the electroless plated pillar base and the bonding pad. The leads are, thereby, all embedded beneath the BCB layer (80). The lead(s) contact the bonding pad (s), pass over the Cu coils and the passivation oxide (50) and make connections to associated peripheral bonding pads. Whether a bridging lead is necessary depends on the coil shape. Such a connection will be schematically illustrated in FIG. 4a below. It is understood that certain geometrically shaped micro-coils will have bonding pad bases that are interior to the outer periphery of the micro-coil and these bases must be connected by bridging leads to bonding pads beyond the periphery of the coil.

Referring next to FIG. 4a, there is schematically illustrated an overhead view of a square spiral micro-coil (100) and the substrate for a central pillar (19) such as that formed in accord with the process steps described above in FIGS. 3a-j. The overhead view clearly illustrates the continuous Cu coil winding (100), the coils in this example having width 3 microns, spacing between adjacent coil segments of 3 microns and a depth of 10 microns. These coils could only be seen as separate vertical cross-sectional segments (40) in FIGS. 3d-j. The substrate (or base) on which a ferromagnetic pillar is formed (19) is shown at the center of the coil. The inner end of the Cu coil is connected to a Cu/(Ti/Al) inner bonding pad (18), which is a Ti/Al bonding pad bilayer ((72, 70) in FIG. 3g) formed over a Cu mesh as described below with reference to FIG. 4b. A Ti/Al bridging lead (17), formed along with the bonding pad bilayer, passes over oxide covered micro-coil windings and connects the inner bonding pad (18) to an minor outer Cu/(Ti/Al) bonding pad (180). A further Cu filled trench (175) connects the Cu mesh of the minor bonding pad (180) to the Cu mesh (210) of the major outer bonding pad (150) which, after being covered by a Ti/Al bonding pad bilayer (200), is used to connect the micro-coil to external circuitry. The outer end of the coil (16) is extended and connected to an outer Cu/(Ti/Al) bonding pad (15) identical to (150). Note that all trenches are formed at the same time, with the same width and depth and are filled with Cu at the same time.

Referring now to FIG. 4b, there is shown an enlarged and more detailed vertical cross-section of a typical Cu/(Ti/Al) bonding pad, such as outer bonding pads (15) and (150), minor outer bonding pad (180), or inner bonding pad (18). With reference to outer bonding pad (150), a bonding pad is fabricated as an Ti/Al (Al on Ti) bilayer (200) formed over and contacting a Cu mesh (210). Note that the Ti/Al bilayer denoted as (200) in this figure is the same as the separately drawn layers (70) and (72) in FIG. 3g. The Cu mesh is a Cu filled grid of orthogonally intersecting trenches (210) embedded to the same depth as the micro-coil trench within the substrate and formed in parallel with and in an identical manner to the formation of the plated Cu micro-coil described above (FIG. 3c-e). The trenches are short linear segments whose length is determined by the required surface area of the bonding pad and whose depth and width is the same as that of the micro-coil trench. A Ti/Al bilayer (200), of slightly larger surface area than that covered by the mesh is then formed over the mesh. The Ti and Al are deposited in a single step. Subsequent electrical connections, such as wire bonding to peripheral components formed on a printed circuit board, are made to the Ti/Al bonding pad bilayer. It is noted that by forming the Cu bonding pad mesh as an intersecting grid of trenches, each having the same width and depth as the micro-coil trench, the grid becomes dimensionally comparable (for plating purposes) with the micro-coil trench within which the Cu coil is plated. It is thus advantageous within the present invention that the Cu mesh and plated coil are formed substantially simultaneously (in parallel with) within the fabrication process. It is noted that inner and outer bonding pads may differ in the cross-sectional surface area of the bonding pad bilayer, but the underlying Cu mesh is formed in the same way and the width and depth of the individual Cu mesh elements is the same regardless of overall area, although their lengths may differ.

Version 2:

In this version of the invention, devices (including micro-coils and micro-coils with pillars) are fabricated on the upper surface of an oxidized Si wafer and are embedded within a layer of dielectric polymer, such as BCB or other suitable material formed on the wafer. An important advantage of Version 2 is that by forming the micro-coils embedded within a thick layer of dielectric polymer, there is a greater range of options for use of the micro-coils in conjunction with other microelectronic fabrications because of the compatibility of the polymer with dielectric materials used in such fabrications. For example, the embedding dielectric polymer is particularly advantageous when the micro-coil device is to be used in conjunction with microelectronic devices that involve RF production, because the properties of dielectric polymer are highly compatible with the properties of the dielectric materials employed in such microelectronic devices and the dielectric polymer is characterized by smaller losses than Si.

Figure 5A:
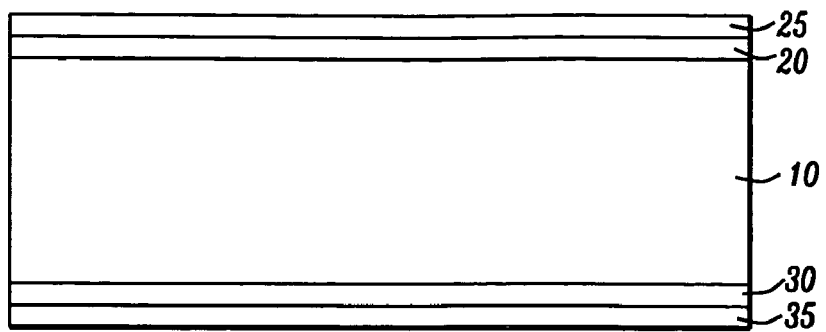
FIGS. 5a-m is a series of schematic process steps used in forming a micro-coil and pillar within a polymeric layer formed on a Si substrate. A substrate thinned to membrane proportions is also shown.

Referring to FIG. 5a, there is shown a substrate, which is a Si substrate (10) (such as a Si wafer) coated with upper (20) and lower (30) oxide layers (Si oxide) and upper (25) and lower (35) nitride layers (Si nitride). The oxide forms an insulating layer for the substrate, while the nitride layer is used as a masking layer for backside etching using (but not limited to), for example, KOH, TMAH, NaOH, HNA, RIE or plasma etching.

Figure 5B:
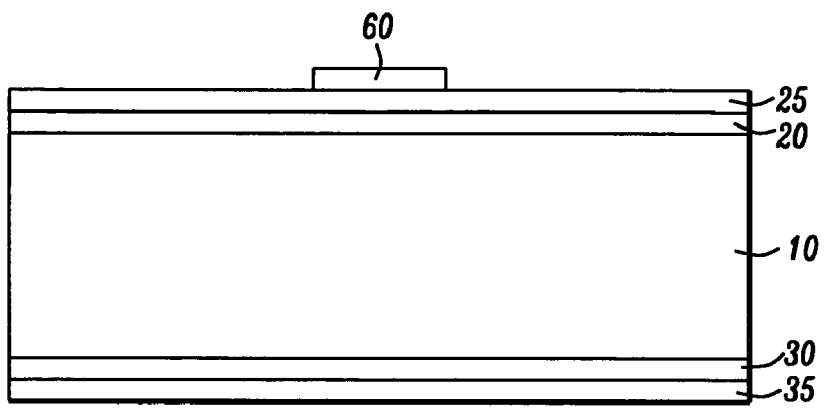

Referring next to FIG. 5b, there is shown the substrate of FIG. 5a on which there is the additional formation of a patterned Ti/Al bilayer (60), formed as described with reference to FIG. 3g above. The bilayer will serve as the base for the subsequent deposition of a ferromagnetic pillar. As already noted, the Al layer (i.e. the upper layer of the bilayer) can be another metal, such as Cu, Au or Ni, but Al is found to have properties that meet the objects of the present invention in an exemplary and advantageous fashion. The formation of this patterned layer is accomplished by well known methods, such as the formation of the bilayer over the entire upper substrate surface, followed by an etching away of portions peripheral to the desired pattern.

Figure 5C:
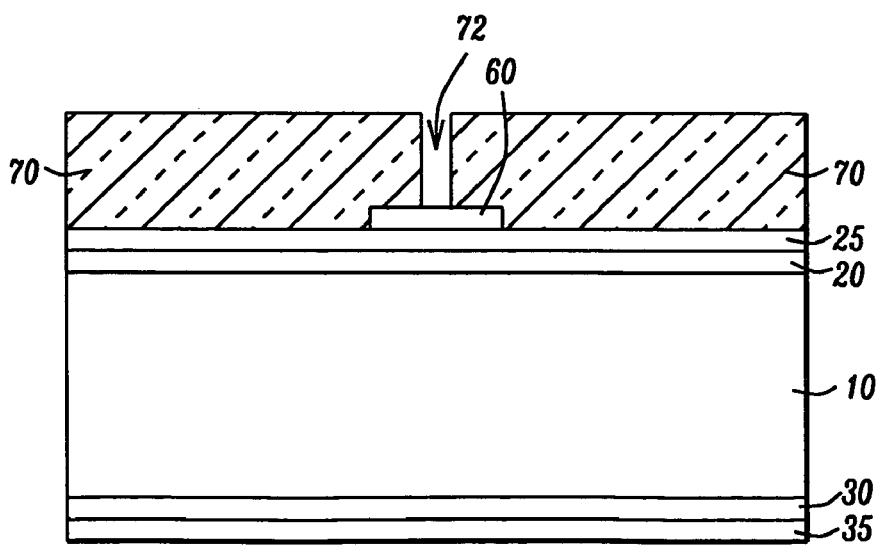

Referring next to FIG. 5c, there is shown the formation of a dielectric layer, which in this embodiment is a layer of BCB polymer (70), formed to a thickness between approximately 12 and 15 microns, and patterned to produce an opening (72) positioned over the patterned Ti/Al bilayer (60) and exposing a portion of the upper surface of the bilayer.

Figure 5D:
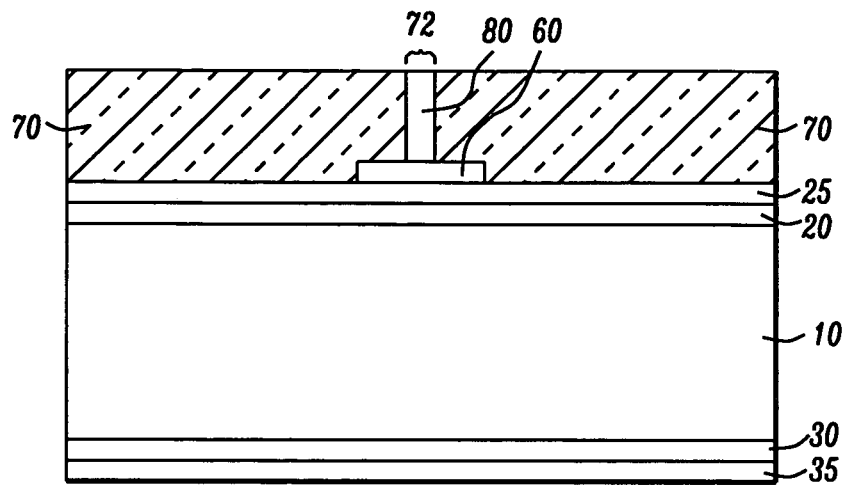

Referring next to FIG. 5d, there is shown the deposition on the Al layer of a first portion of a NiCoP ferromagnetic pillar (80), by electroless plating of the NiCoP within the opening ((72) in FIG. 5c) in the BCB layer. It is to be noted that other ferromagnetic materials of high permeability can be used instead of the NiCoP. As has already been discussed, the pillar will concentrate the magnetic flux of the micro-coil, hence the requirement of a ferromagnetic material of high permeability.

Figure 5E:
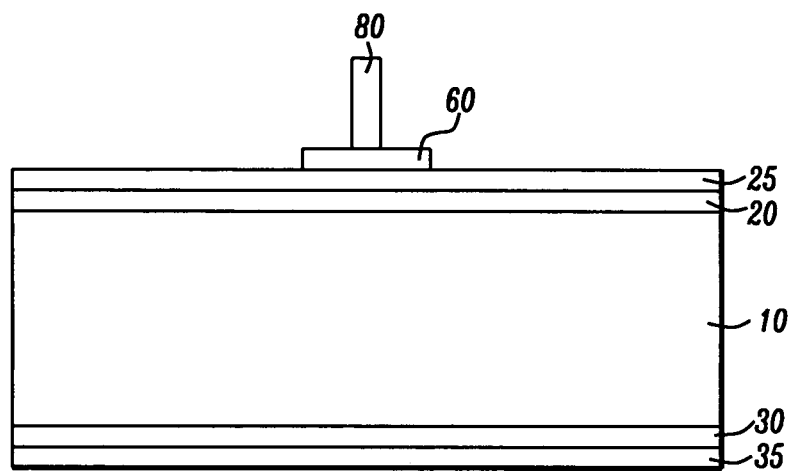

Referring next to FIG. 5e, there is shown the fabrication of FIG. 5d after the removal of the BCB layer to leave the exposed first portion of the NiCoP pillar (80) formed on the Ti/Al bilayer (60).

Figure 5F:
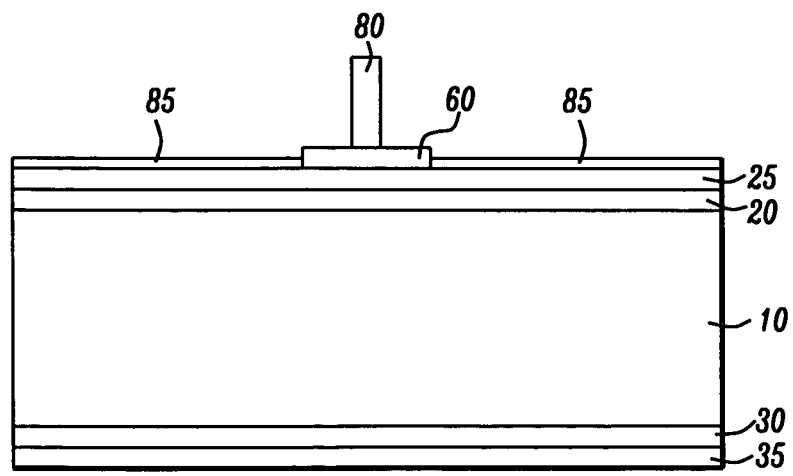

Referring next to FIG. 5f, there is shown the fabrication of FIG. 5e, with the subsequent deposition of a Cu seed layer (85), disposed about the Ti/Al bilayer base of the first pillar portion, formed to a thickness between approximately 500 angstroms and 2000 angstroms by a process of sputtering. The seed layer is thinner than the base of the pillar.

Figure 5G:
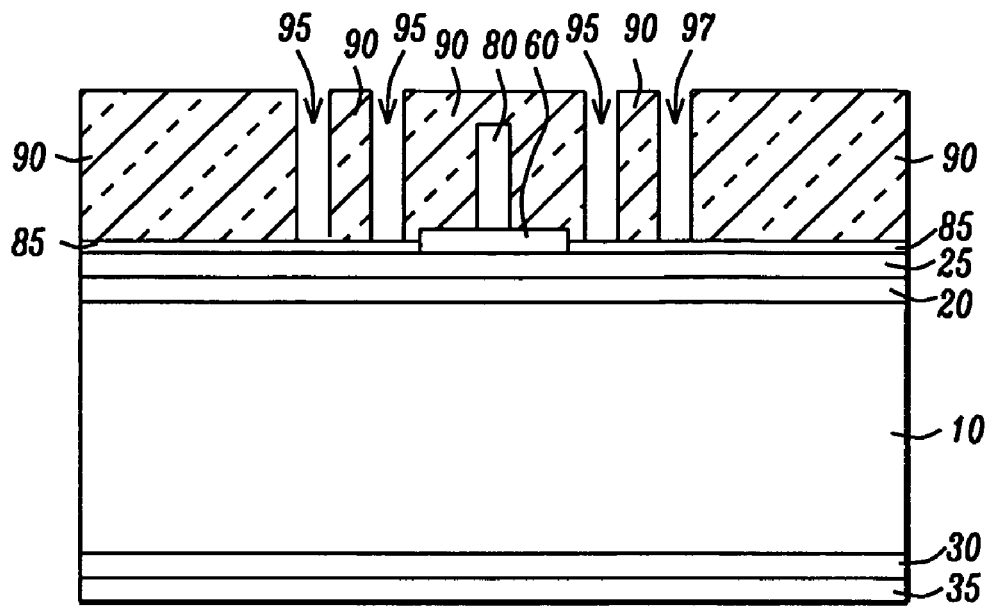

Referring next to FIG. 5g, there is shown the fabrication of FIG. 5f with the additional deposition of a second layer (90) of BCB or other dielectric polymer. The BCB layer covers the first portion of the plated pillar (80) and is patterned (95) with trenches of a suitable depth between approximately 15 microns and 20 microns (which is substantially the thickness range of the layer (90)) for the subsequent formation of the Cu micro-coil. An additional trench (97) will be used to form the mesh bonding pad array as discussed above. The patterning is done using photolithographic methods well known in the art and they are not discussed herein. It is to be noted that, in this version of the invention, because the BCB layer serves as a form, the aspect ratio of the coil can be much larger than 10/3, preferably exceeding 3, with aspect ratios of 20/3, 30/3 or higher, being appropriate for meeting the objects of the invention.

Figure 5H:
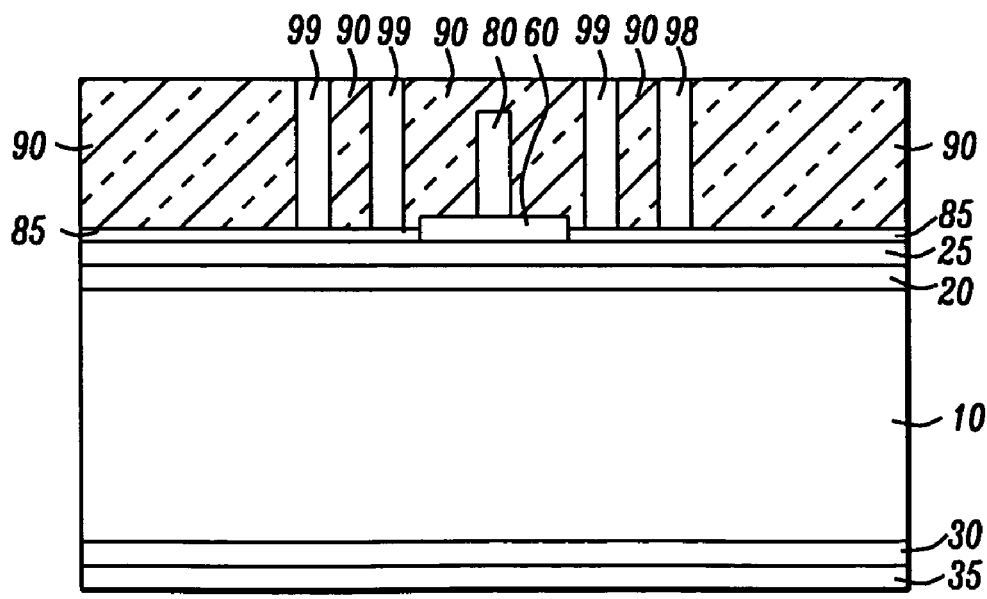

Referring next to FIG. 5h there is shown the fabrication of FIG. 5g with the subsequent deposition, by electroplating, of a Cu micro-coil (99) within the patterned trenches (95) of the BCB layer, the Cu filling the trenches conformally and in a void-free manner. The Cu bonding pad mesh is shown as (98).

Figure 5I:
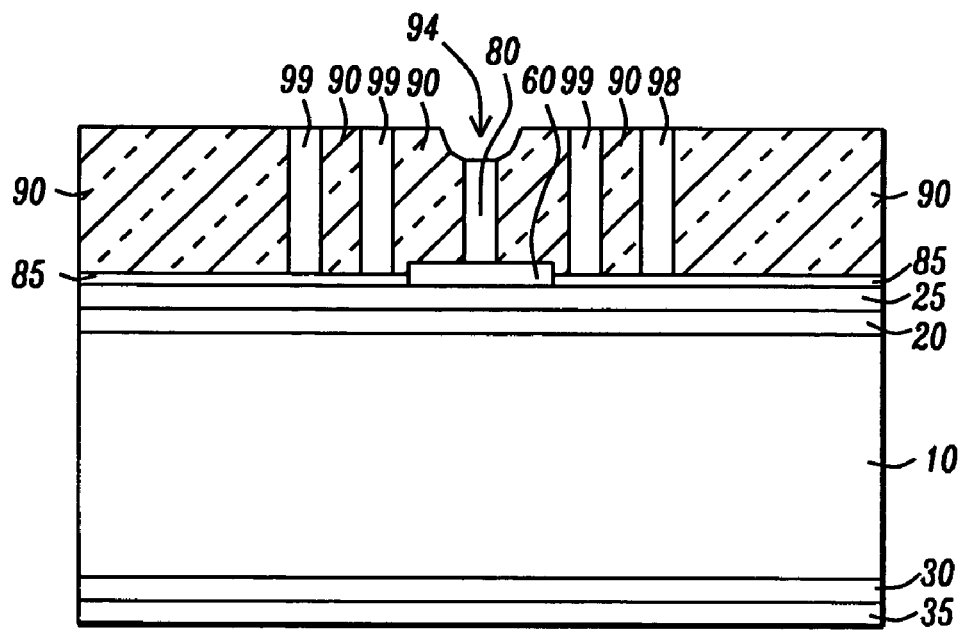

Referring next to FIG. 5i, there is shown the fabrication of FIG. 5h with the additional patterning of the BCB layer by the opening of a window region (94) about the already deposited first pillar portion (80), said opening exposing thereby its upper surface. It is to be noted that at this stage of the fabrication the upper surface of the pillar may have a Cu layer formed upon it during the deposition of the Cu seed layer, and in this case after the window opening (94) a dry etch (eg. a plasma etch) of Cu would need to be performed before additional electroless plating of NiCoP upon the already formed first portion of the pillar (80) to form a second portion of the pillar.

Figure 5J:
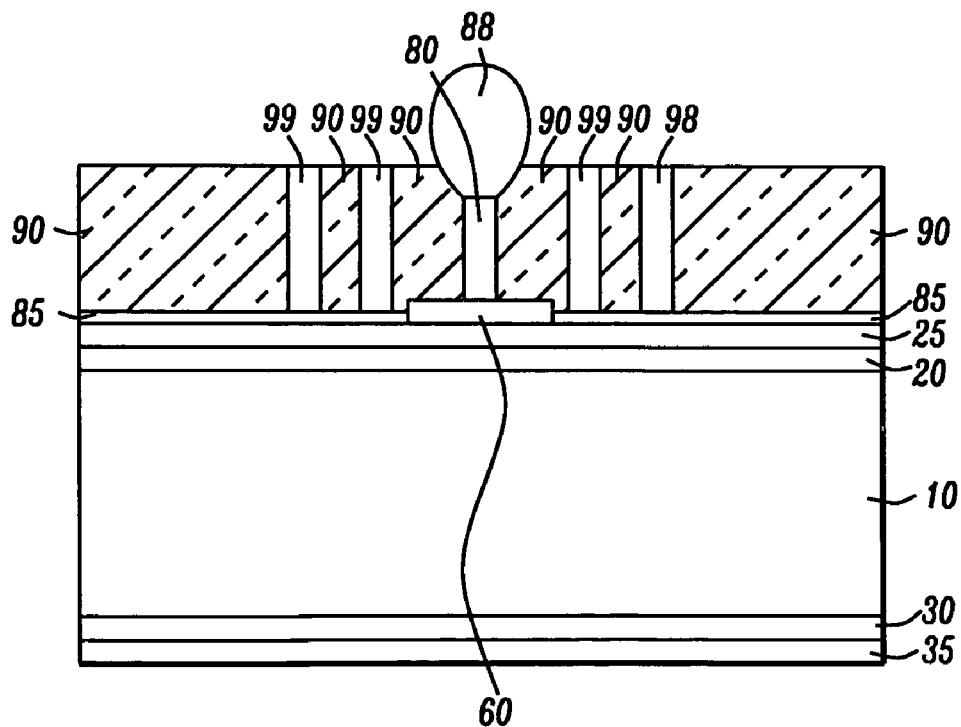

Referring next to FIG. 5j, there is shown the electroless plating of a second portion of an NiCoP pillar (88) onto the already plated first portion (80). This second portion can be plated to add an additional height of between approximately 10 microns and 50 microns to the already plated pillar. The second portion of the pillar is approximately hemispherical or mushroom in shape as shown in the figure. The second portion of the plated NiCoP grows in three directions since there is no dielectric layer serving as a mold to constrain it.

At this stage in the fabrication the backside of the substrate can be optionally etched with, for example, a solution of KOH or TMAH (note: many etchants will be suitable, for example NaOH, EDP, HNA, RIE, DRIE or plasma etching) to allow the wafer to be thinned to the point where it acquires the properties of a flexible silicon or silicon nitride membrane. The etching process will penetrate the oxide and nitride layers on the substrate underside and penetrate into the body of the Si wafer, stopping just below the substrate upper surface. Such a thin and flexible membrane can be used if the coil is to be mounted on a device with non-planar configuration.

Figure 5K:
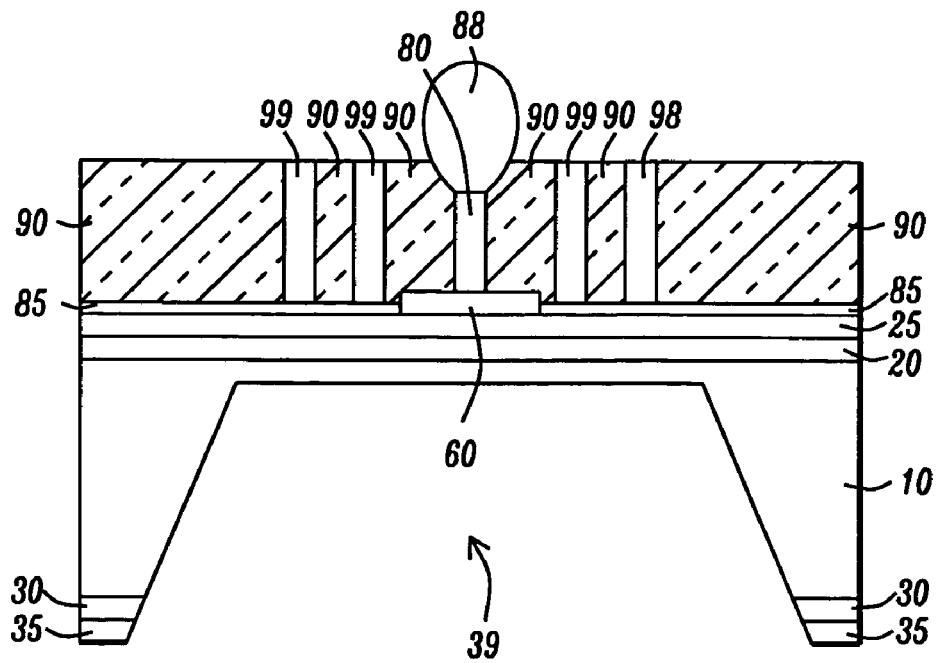

Referring to FIG. 5k, there is shown this optional step of backside etching, to remove a portion of the lower oxide (30) and nitride (35) to expose the substrate and to etch a cavity (39) therein. The resulting membrane mounted micro-coil is shown with the pillar that has been formed, but it need not have a pillar. The formation of an embodiment of this second version without a pillar will be described below with reference to FIGS. 6 a-g.

The following figures, FIGS. 5 l, m, will continue to show the wafer with its backside etched, but it is to be understood that the remaining process steps apply equally to a wafer that is not to be formed to a membrane thickness.

Figure 5L:
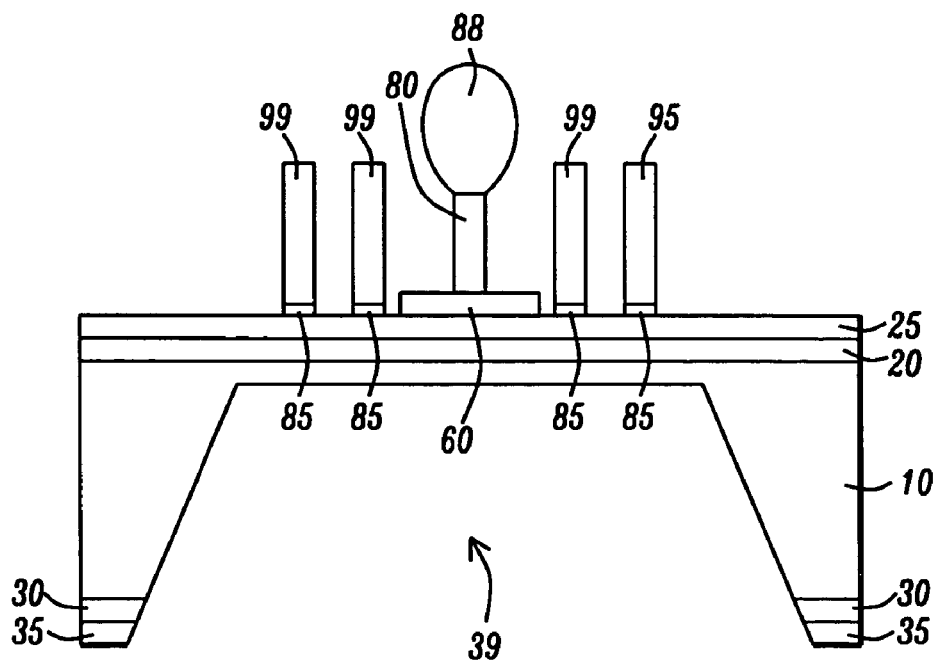

Referring to FIG. 5l, there is shown the wafer of FIG. 5k wherein the second BCB dielectric layer and portions of the Cu seed layer ((85 in FIG. 5o on which no plating has occurred, have been removed by a suitable etching process as noted above, leaving only the micro-coil (99) and the bonding pad mesh (98) with portions of the seed layer beneath them. As noted, the substrate is shown thinned to membrane proportions, but, in general, the substrate need not and will not be thinned.

Figure 5M:
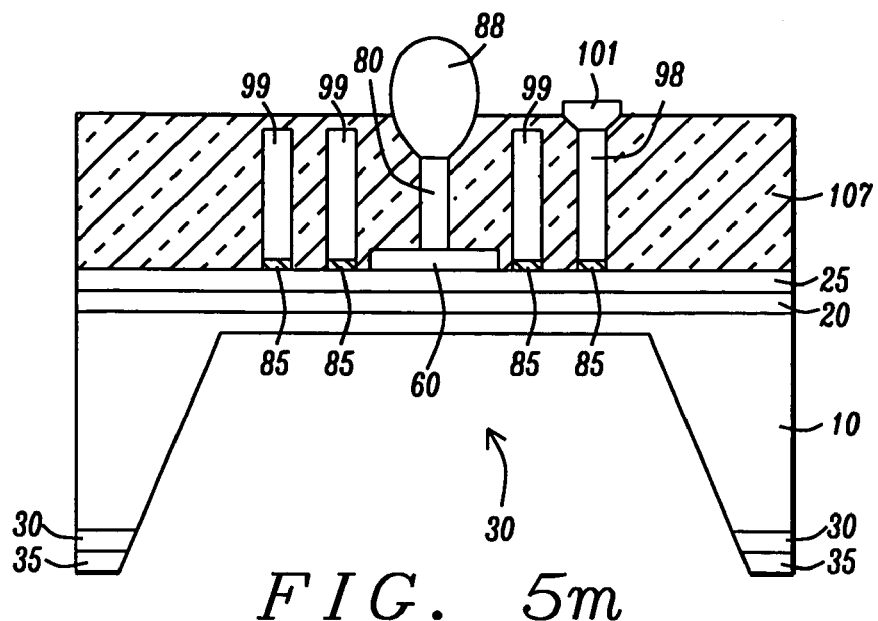

Referring to FIG. 5m, there is shown the formation of a third dielectric layer (107) (again, typically BCB), that replaces the second dielectric layer ((90) in FIG. 5g) that was removed in FIG. 5e so that the Cu seed layer could also be removed. The third dielectric layer (107) is formed to a thickness that is slightly greater than the height of the micro-coil, yet leaves the upper portion of the ferromagnetic pillar exposed. With the formation of the third dielectric layer, the substrate is passivated and the dielectric-embedded micro-coil can now benefit from dielectric properties that are not possessed by the Si substrate. Such properties will, for example, allow the embedded micro-coil to be integrated with RF and HF circuitry. Subsequent to the BCB layer formation a window is opened over the Cu bonding pad mesh and a Ti/Al deposition (101) within the window is formed contacting the Cu mesh to complete the bonding pad. It may be necessary to cleanse the upper surface of the exposed mesh with, for example, a plasma etch, so that good electrical contact with the Ti/Al layer can be made.

The device fabricated in the description above included a ferromagnetic pillar. The objects of the invention can be met by a similar micro-coil device that does not include a pillar. Such a device is an embodiment of the invention within version 2. FIGS. 6a-g will illustrate the fabrication of the micro-coil device without a pillar.

Figure 6A:
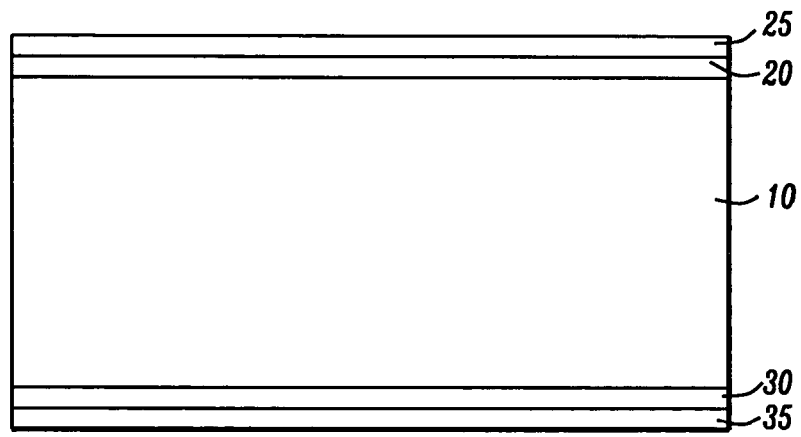
FIGS. 6a-g show the formation of a micro-coil as in FIGS. 5a-o, but without the formation of a pillar.

Referring to FIG. 6a, there is shown a substrate, which is a Si substrate (10) (such as a Si wafer) coated with upper (20) and lower (30) oxide layers (Si oxide) and upper (25) and lower (35) nitride layers (Si nitride). The oxide forms an insulating layer for the substrate, while the nitride layer is used as a masking layer for backside etching.

Figure 6B:
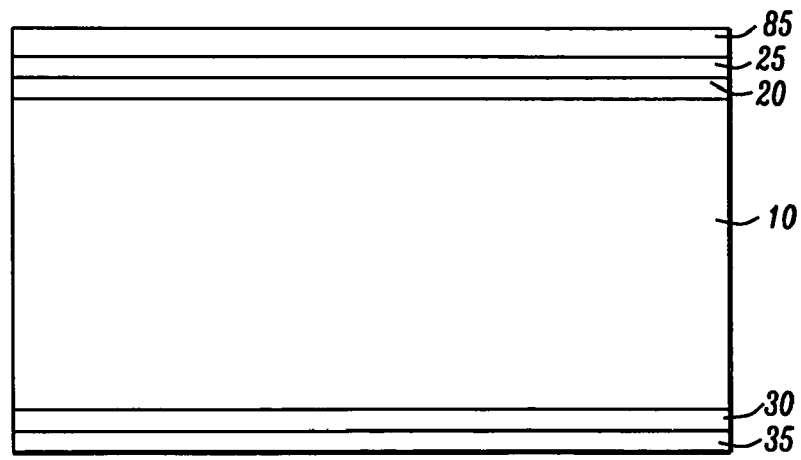

Referring next to FIG. 6b, there is shown the substrate of FIG. 6a, with the deposition of a Cu seed layer (85), formed to a thickness between approximately 500 angstroms and 2000 angstroms by a process of sputtering.

Figure 6C:
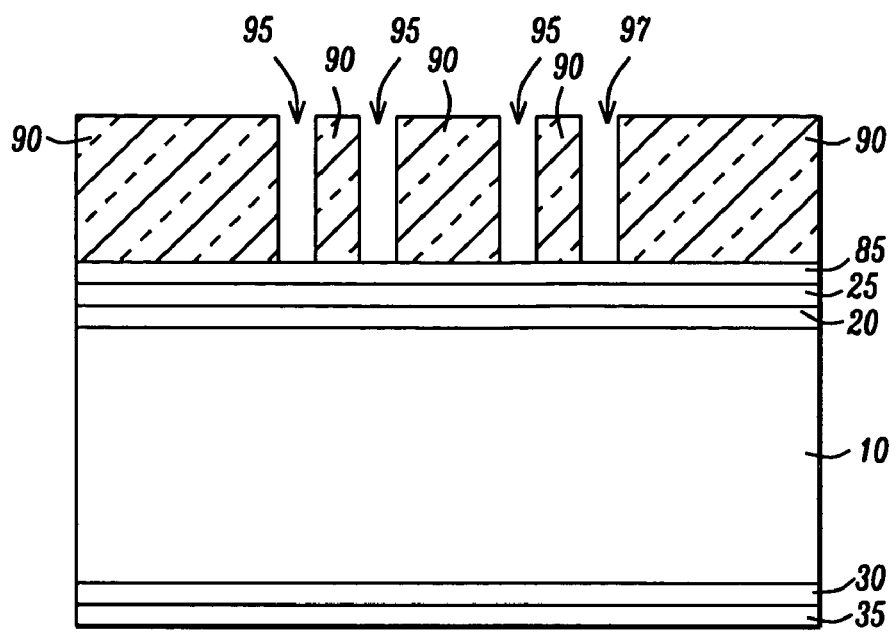

Referring next to FIG. 6c, there is shown the fabrication of FIG. 6b with the deposition of a first layer (90) of BCB or other dielectric polymer. The BCB layer is patterned (95) with trenches of a depth between approximately 15 microns and 20 microns (which is substantially the thickness range of the layer (90)) for the subsequent formation of the Cu micro-coil and with trenches (97) for the formation of a bonding pad mesh as above. The patterning is done using photolithographic methods well known in the art and they are not discussed herein. It is to be noted that, in this version of the invention, the aspect ratio of the coil can be much larger than 10/3, preferably exceeding 3, with aspect ratios of 20/3, 30/3 or higher, being appropriate for meeting the objects of the invention.

Figure 6D:
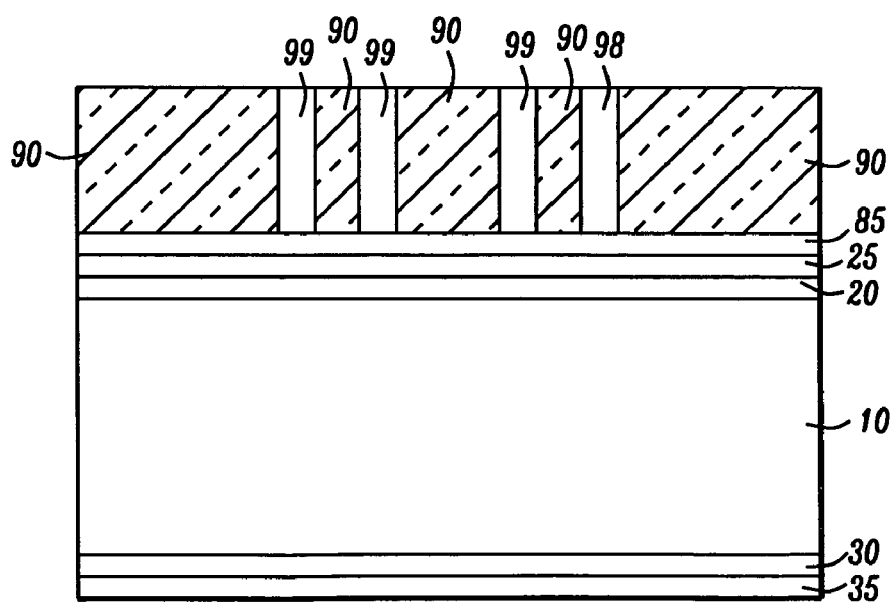

Referring next to FIG. 6d there is shown the fabrication of FIG. 6c with the subsequent deposition, by electroplating, of a Cu micro-coil (99) within the patterned trenches (95) of the BCB layer, the Cu filling the trenches conformally and in a void-free manner. A bonding pad mesh (98) is also formed.

At this stage in the fabrication the backside of the substrate can be optionally etched with, for example, a solution of KOH or TMAH (note: many etchants will be suitable, for example NaOH, EDP, HNA, RIE, DRIE or plasma etching) to allow the wafer to be thinned to the point where it acquires the properties of a flexible silicon or silicon nitride membrane. The etching process will penetrate the oxide and nitride layers on the substrate underside and penetrate into the body of the Si wafer, stopping just below the substrate upper surface. Such a thin and flexible substrate can be used if the coil is to be mounted on a device with non-planar configuration.

Figure 6E:
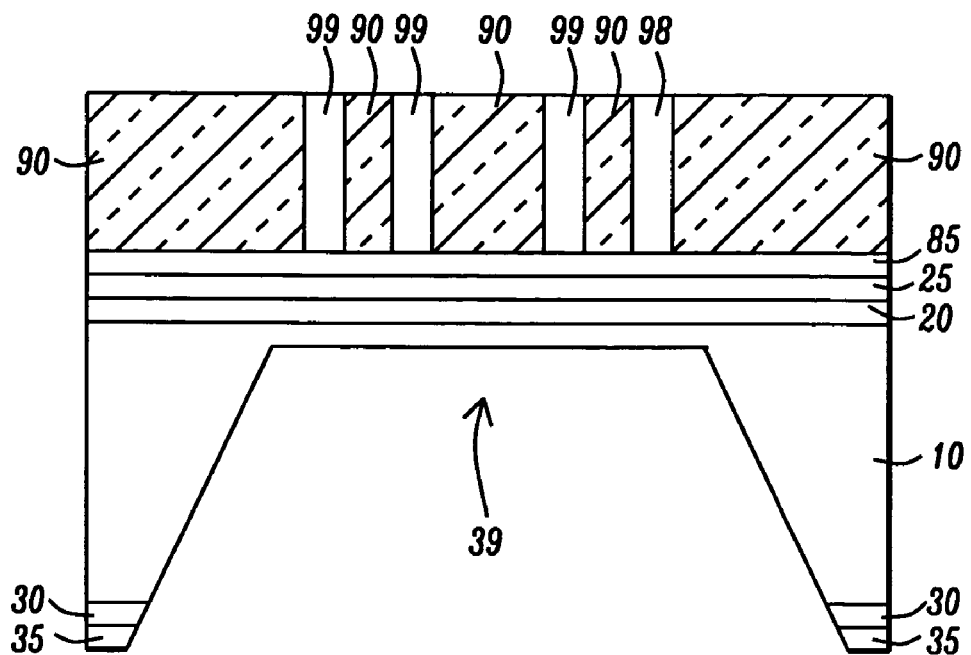

Referring to FIG. 6e, there is shown this optional step of backside etching, to remove a portion of the lower oxide and nitride and remove a portion of the Si substrate (39). The micro-coil, now formed on the resulting thinned substrate, behaves as a membrane mounted micro-coil.

The following figures will continue to show the wafer with its backside etched, but it is to be understood that the remaining process steps apply equally to a wafer that is not to be reduced to a membrane thickness.

Figure 6F:
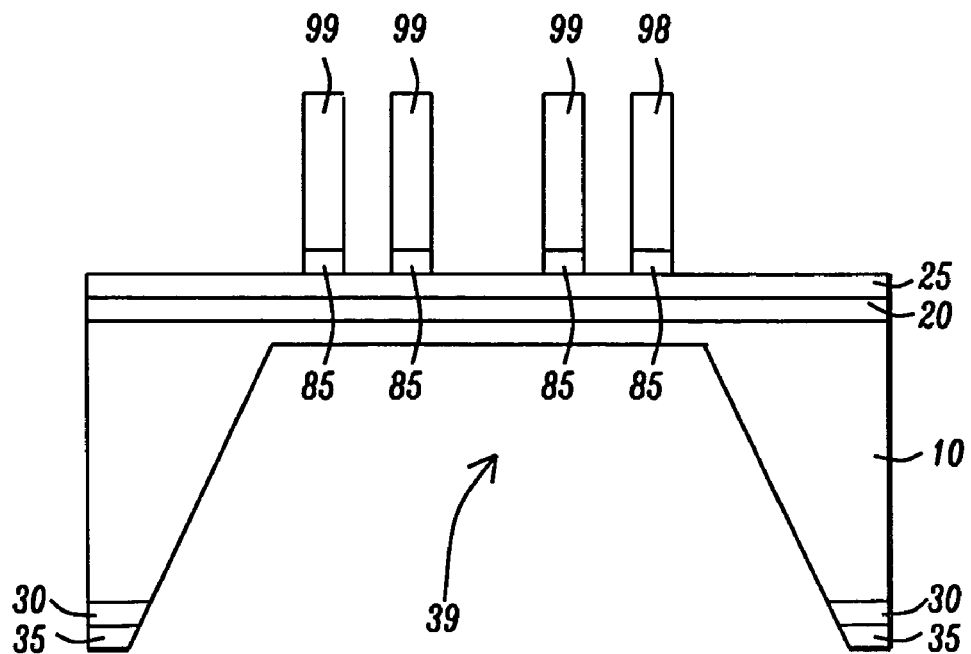

Referring to FIG. 6f, there is shown the wafer of FIG. 6e wherein the first BCB dielectric layer and those portions of the Cu seed layer on which no plating has occurred have been removed by a suitable etching process (using etchants as noted above), leaving only the exposed micro-coil (99) and mesh (98) formed on the remaining portions of the seed layer (85). As noted, the substrate is shown thinned to membrane proportions, but, in general, the substrate need not and will not be thinned.

Figure 6G:
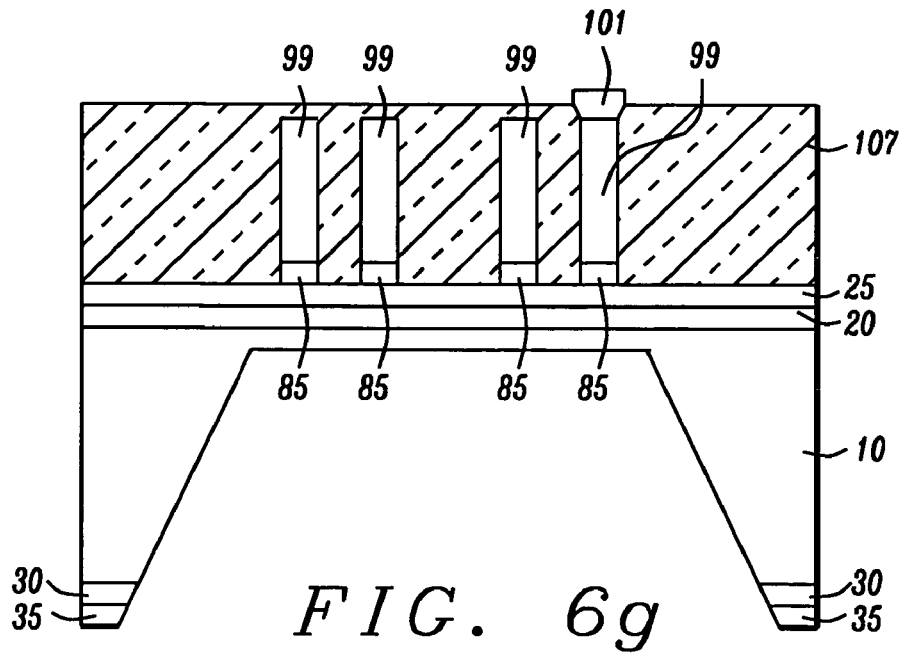

Referring to FIG. 6g, there is shown the formation of a second dielectric layer (107) (again, typically a layer of BCB in this preferred embodiment), that replaces the first dielectric layer (90) that was removed (in FIG. 6o so that the Cu seed layer could also be removed. The second dielectric layer is formed to a thickness that is slightly greater than the height of the micro-coil, said thickness being within the range between 15 microns and 25 microns. With the formation of the second dielectric layer, the substrate is passivated and the dielectric-embedded micro-coil can now benefit from dielectric properties that are not possessed by the Si substrate. Such properties will, for example, allow the embedded micro-coil to be integrated with RF and HF circuitry. Subsequent to the BCB layer formation a window is opened for via formation and is followed by Ti/Al deposition (101) within the window and contacting the Cu mesh. It may be necessary to cleanse the upper surface of the exposed mesh with, for example, a plasma etch, so that good electrical contact with the Ti/Al layer can be made. The Ti/Al layer is a bonding-pad that allows electrical contact to be made to the micro-coil embedded within the BCB third dielectric layer.

Version 3:

Version 3 of the present invention includes the addition of a backplate formed of highly permeable ferromagnetic material formed within the lower surface of the silicon wafer substrate, using electroless plating as has already been applied to the pillar formation. Further, the magnetic pillar is extended vertically downward through the upper substrate surface to contact the backplate and, thereby, produce an enhanced magnetic-flux-containing circuit formed by the micro-coil, the pillar and the backplate. This configuration very strongly focuses the magnetic field lines within the pillar of the device, or within the pillars, if the device includes a plurality of micro-coils and pillars.

Figure 7A:
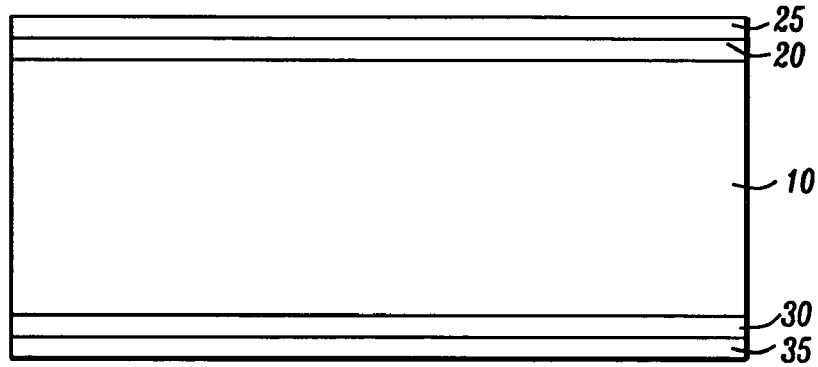
FIGS. 7a-l is a series of schematic steps used in forming a micro-coil, pillar and back-plate.

Referring to FIG. 7a, there is shown a silicon wafer substrate (10) having an upper (20) and lower (30) oxide layer formed thereon. Each oxide layer is covered by a layer of nitride, wherein nitride layer (25) covers oxide layer (20) and nitride layer (35) covers oxide layer (30).

Figure 7B:
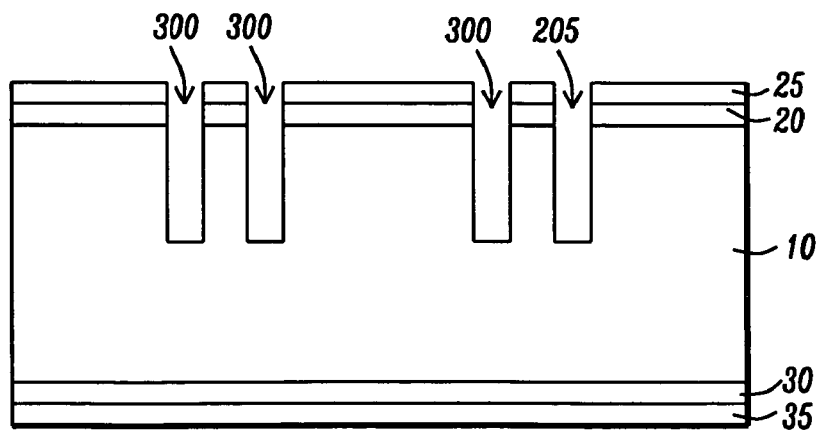

Referring next to FIG. 7b, there is shown the wafer of FIG. 3a now being patterned in preparation for the deposition of the coil conductor. The pattern is produced by forming trenches (300), for a micro-coil and (205), for a bonding pad mesh, through the Si oxide and nitride layers and into the Si substrate using DRIE (or other suitable etchant) as the etching mechanism. The trenches in this example have an aspect ratio of 10/3 (but aspect ratios greater than 3/1 will meet the objects of the invention) corresponding to the preferred dimensions of the conducting coil and in this preferred embodiment the trenches will have a width of 3 microns and a depth of 10 microns. The geometrical pattern of the trenches corresponds to the particular coil design described in FIGS. 1a-j being fabricated.

Figure 7C:
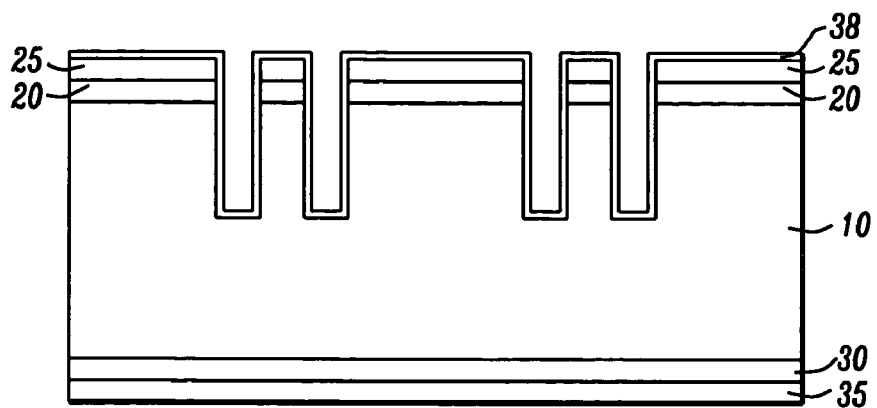

Referring next to FIG. 7c, there is shown the trenches (300) and (205) of FIG. 3b subsequent to the sequential formation of a tri-layer consisting of an insulating oxide formed to a thickness between approximately 500 angstroms and 4000 angstroms, a Ti/TiN barrier layer formed over the oxide to a thickness between approximately 200/200 angstroms and 2000/2000 angstroms and a Cu seed layer formed over the barrier layer to a thickness between approximately 500 angstroms and 2000 angstroms. The three layers, which conformally cover the exposed trench surfaces, allow a high quality plated deposition of Cu coils within the trenches. See also FIG. 3c for this same formation. For clarity in the illustrations, this tri-layered formation will be shown as a single, undifferentiated layer (38) in FIGS. 7c et seq.

Figure 7D:
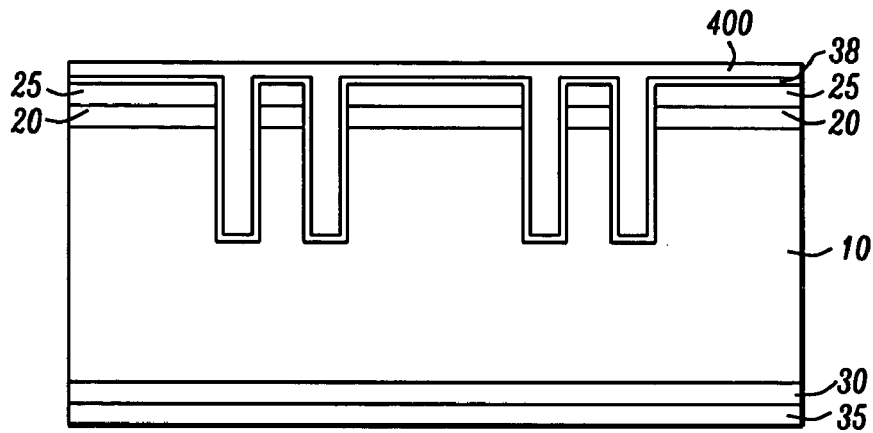

Referring next to FIG. 7d, there is shown the deposition of a Cu layer (400) over the tri-layer (38), the Cu layer conformally filling the trenches. The Cu layer is deposited by an electroplating process that is well known in the art and will not be described in further detail herein.

Figure 7E:
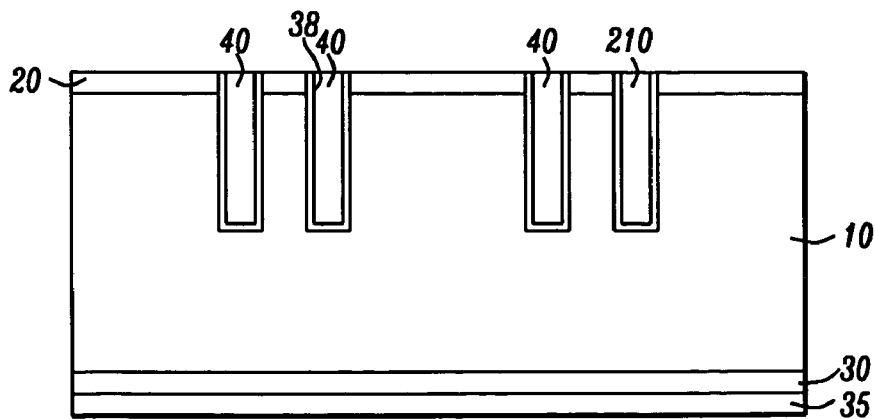

Referring next to FIG. 7e, there is shown the fabrication of 7d subsequent to a chemical mechanical polishing (CMP) to remove excess electroplated Cu (400) and the tri-layer (38) on the upper substrate surface and leave the Cu remaining within the trenches (40) as the micro-coil and the bonding pad mesh (210). The CMP thereby exposes and planarizes the upper oxide surface of (20).

Figure 7F:
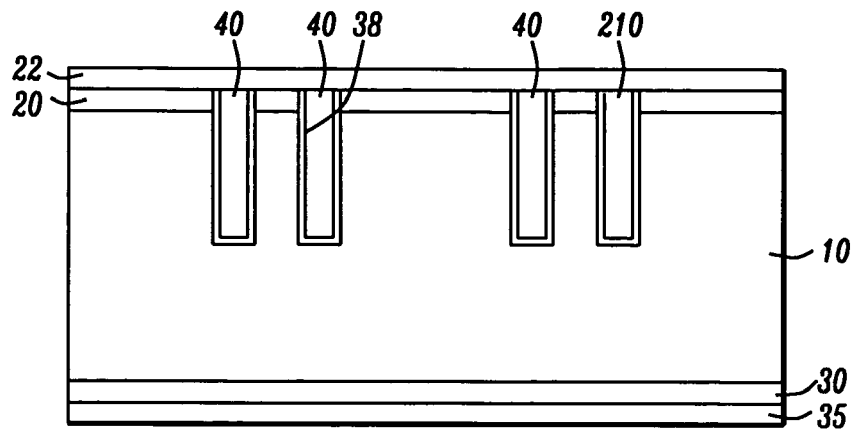

Referring next to FIG. 7f, there is shown the fabrication of FIG. 7e with the formation of an additional, second oxide layer (22) of thickness between approximately 500 angstroms and 1 micron (with approximately 1000 angstroms being preferred) covering the first oxide layer (20) and the exposed surfaces of the Cu micro coil and mesh.

Figure 7G:
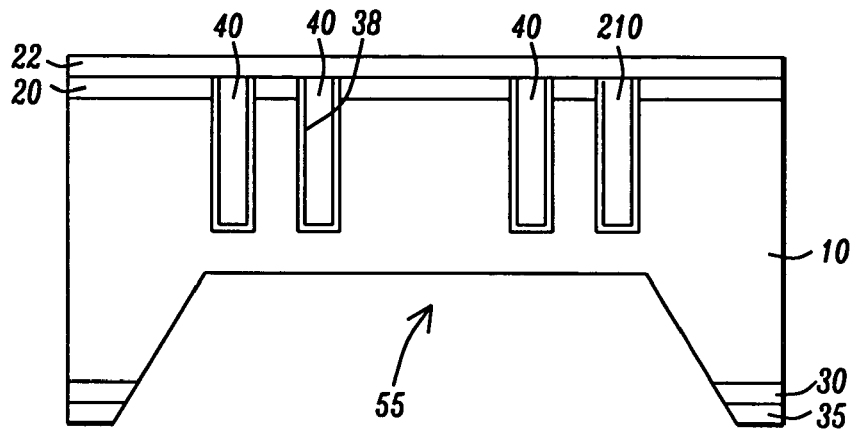

Referring to FIG. 7g, there is shown the fabrication of 7f with the backside of the wafer etched (using TMAH, KOH or other suitable etchants as discussed above) to create a cavity (55) of approximate depth between 300 and 550 microns, with 550 microns being preferred.

Figure 7H:
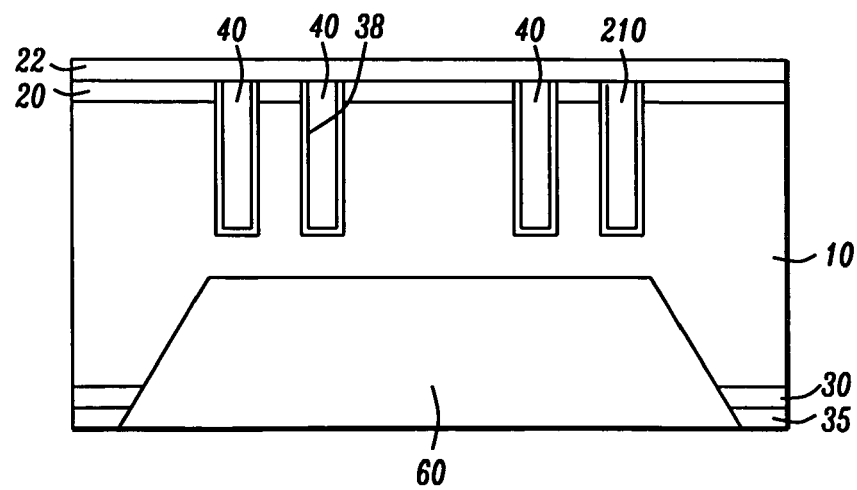

Referring next to FIG. 7h, there is shown the fabrication of FIG. 7g with the addition of an electroless plated layer (60) of NiCoP (or other highly permeable ferromagnetic material) within the cavity.

Figure 7I:
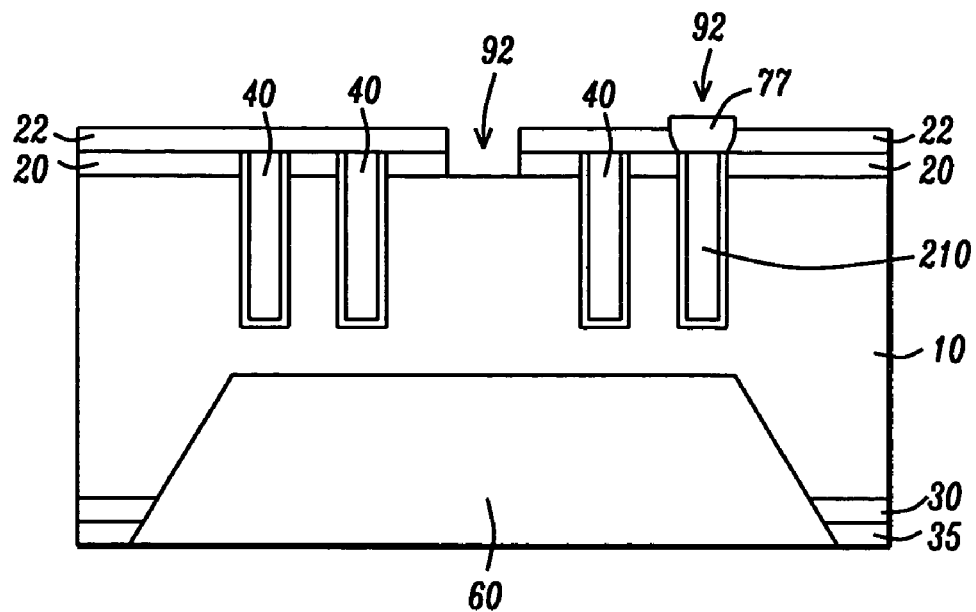

Referring next to FIG. 7i, there is shown the fabrication of FIG. 7h wherein a window opening (92) has been etched through oxide layer (22) to expose an upper surface of the Cu mesh (210) and the bonding pad has been completed by forming a Ti/Al bilayer (77) within that window contacting that exposed mesh surface. The bilayer is formed to a total thickness between approximately 250 angstroms and 1 micron as has already been described above. For a more detailed discussion of this bonding pad base see the discussion along with FIG. 3g. In addition to the window for the Ti/Al bilayer formation, a window (92) is formed to expose a portion of the Si substrate (10) for the purpose of subsequent vertical trench formation to accommodate the ferromagnetic pillar.

Figure 7J:
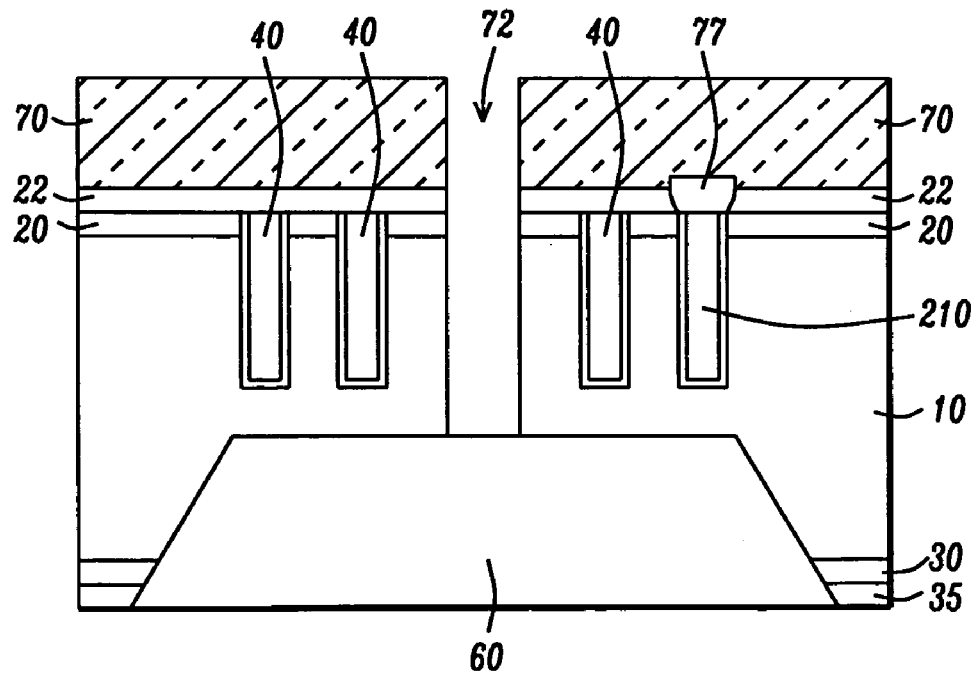

Referring next to FIG. 7j, there is shown the fabrication of FIG. 7i with the addition of a layer (70) of BCB or similar dielectric polymer formed over the oxide layer (22) to a thickness between approximately 5 and 50 microns with approximately 10 microns being preferred. A vertical trench (72), between approximately 55 and 100 microns in depth and between approximately 10 and 100 micron in diameter is etched through the BCB layer (70) and the silicon substrate (10), the trench thereby exposing an upper surface of the NiCoP backside layer (60).

Figure 7K:
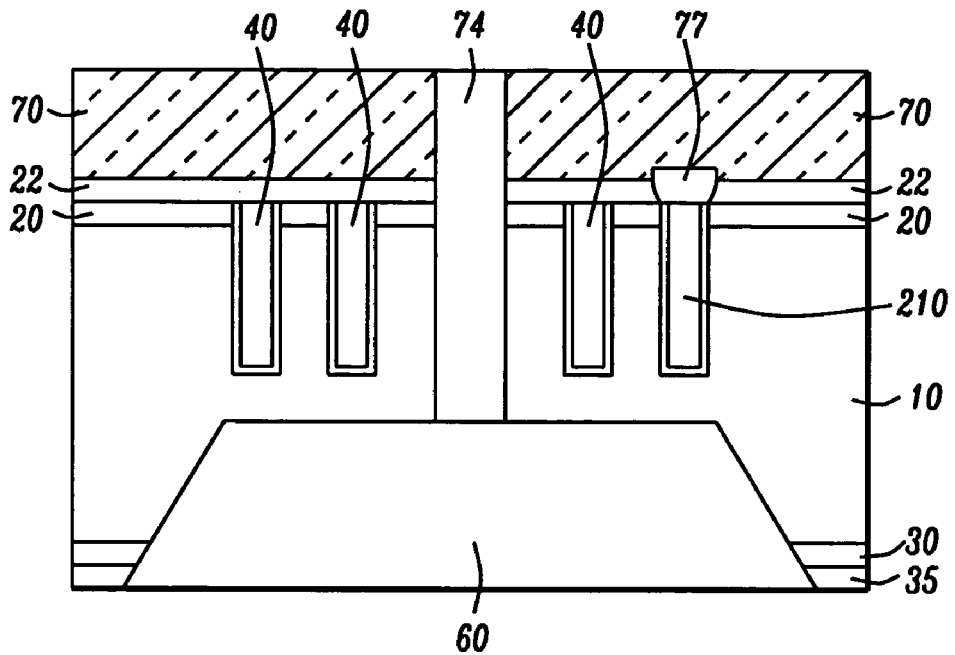

Referring next to FIG. 7k there is shown an electroless plated ferromagnetic NiCoP pillar (74) formed within the trench (72), the plated pillar extending upward from the upper exposed surface of the NiCoP layer (60) (on which it is plated) to the upper surface of the BCB layer (70).

Figure 7L:
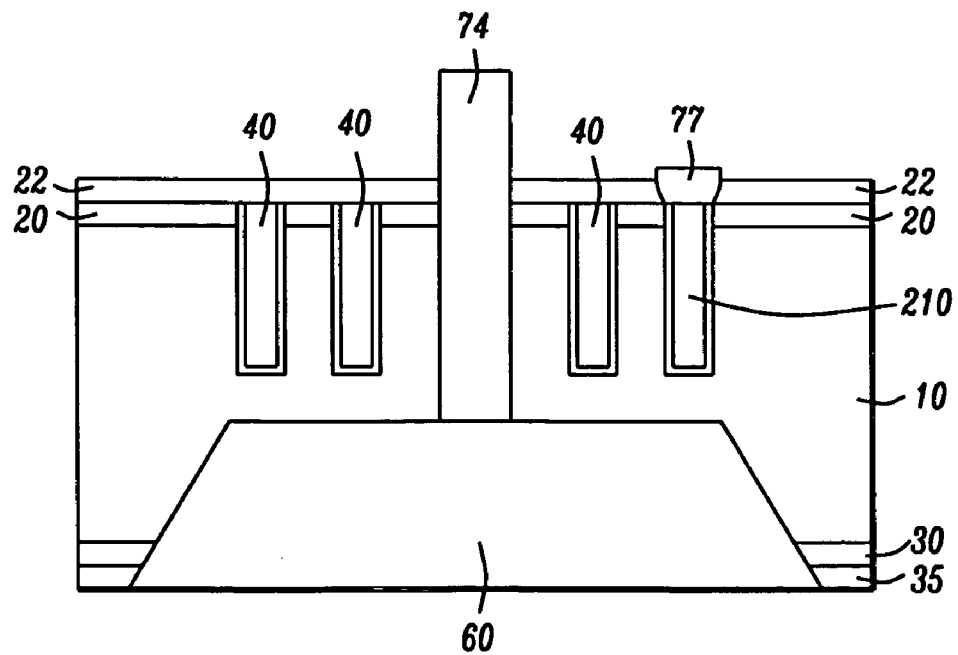

Referring next to FIG. 7l, there is shown the fabrication of FIG. 7k, wherein layer (70), the BCB layer, has been removed by etching, leaving the oxide layer (22) to serve as a passivation layer. The pillar (74) now extends above the passivation layer.

Figure 8:
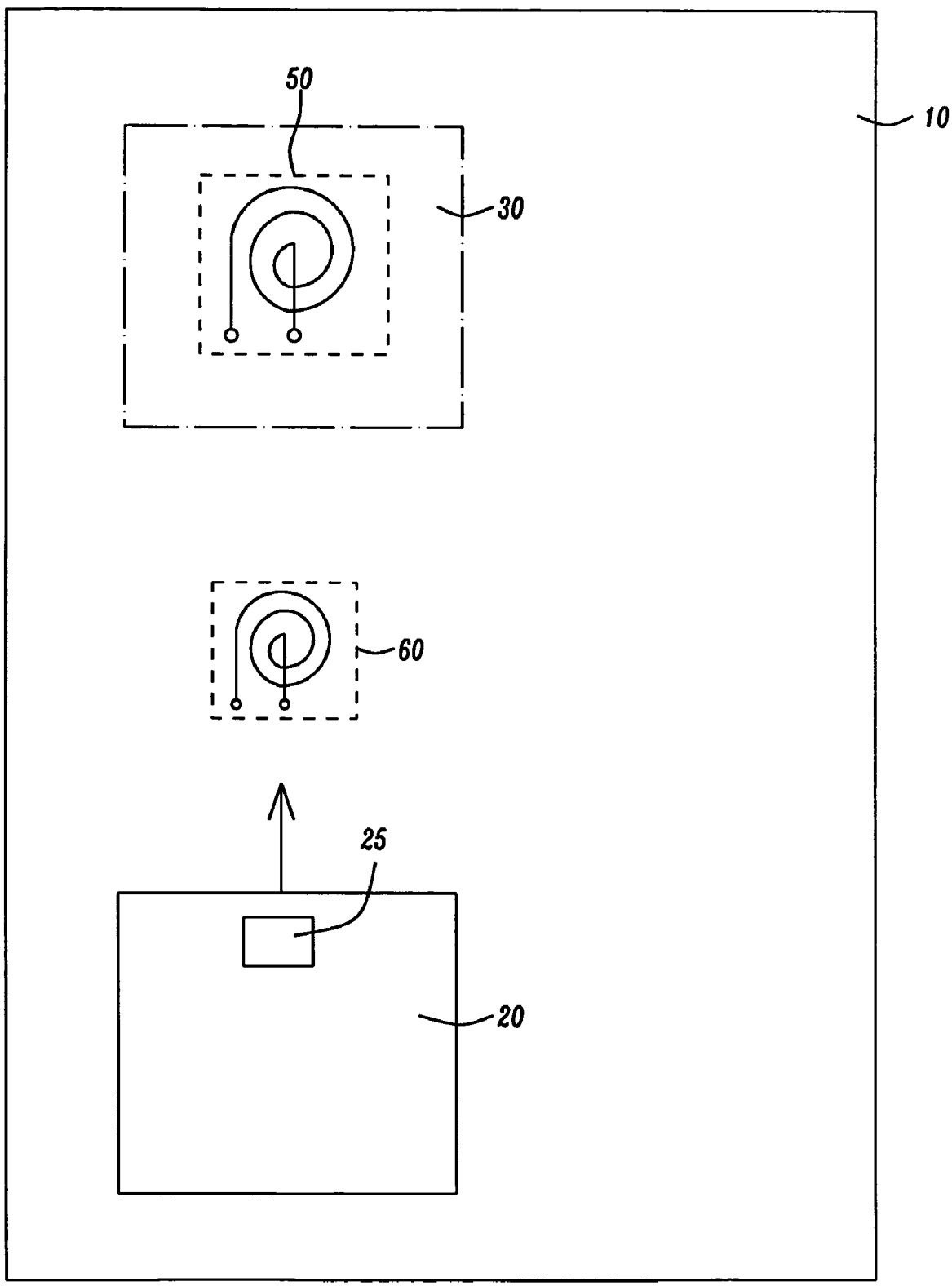
FIG. 8 shows a schematic representation of micro-coils positioned on or in a substrate, the micro-coils being used to guide micro-components to receptor sites on the substrate at which sites they are trapped for subsequent permanent affixing to the substrate.

Referring finally to FIG. 8 there is shown a schematic diagram of an exemplary micro-self-assembly process on a substrate (10). Here, a typical micro-component (20) is being guided (the arrow showing motion) to a receptor site (30), shown in dashed-outline as a rectangular opening. A micro-coil (50) is shown (also in dashed line outline) either on, or within the substrate at the position of the receptor site (30). The micro-component will be trapped at that site by the micro-coil and ultimately affixed to that site by known bonding processes. An auxiliary micro-coil (60), also either on, or within the substrate, can be used to facilitate the guidance of the micro-component. As discussed previously, this magnetic guidance and trapping process facilitates the assembly and connection (electrical and/or physical) of multiple and diverse micro-components individually fabricated from various materials, including but not limited to III-V type semiconductor materials, on a large substrate. Each of the components to be assembled can be coated with magnetic material (25) so they are subject to the magnetic forces produced by the energized micro-coils (50) and (60). The coils at receptor sites, when energized by currents, provide magnetic potential wells and associated magnetic binding energy to both trap the components at proper positions on the substrate and to guide the components to those positions. If necessary, additional micro-coils (60) can be positioned along pre-determined paths so as to facilitate the guidance of the micro-components to the positions of the trapping micro-coils located at the receptor sites. Once the micro-components are held in place by the micro-coil generated magnetic fields, they can be more permanently affixed to the substrate by various bonding techniques known in the art. The micro-coils can be positioned on or within the substrate. It is noted that the process may be advantageously performed while the substrate and micro-components are immersed in a fluid providing sufficient viscosity so that the guidance and fastening can be performed in a stable and regulated manner and so that local surface interaction effects can be reduced or eliminated.

As is understood by a person skilled in the art, the preferred embodiments of the present invention are illustrative of the present invention rather than limiting of the present invention. Revisions and modifications may be made to methods, materials, structures and dimensions employed in fabricating micro-coil devices with and without ferromagnetic pillars and backplates for use in the generation, focusing and manipulating magnetic fields, while still providing a method for fabricating such micro-coil devices with and without ferromagnetic pillars and back-plates in accord with the spirit and scope of the present invention as defined by the appended claims.

What is claimed is:

1. A micro-coil device for the generation, focusing and manipulation of magnetic fields and the exertion of magnetic forces on magnetizable particles thereby, comprising:
- a substrate having an upper and a lower surface;
- a micro-coil, formed of a plated conductor having an aspect ratio greater than 3/1, formed in a variety of geometrical shapes on the upper surface of the substrate or in a trench formed through said upper surface and said micro-coil having at least two ends electrically connected to bonding pads for making electrical connections to said micro-coil whereby a current can be introduced into said micro-coil to produce a magnetic field thereat;
- a passivating oxide layer formed over said micro-coil;
- a dielectric layer formed over said oxide layer; and
- at least one pillar formed of ferromagnetic material having a high permeability, said pillar having an upper and lower end, said pillar being located at a position of maximum magnetic field strength generated by said micro-coil and the lower end of said pillar contacting a patterned metal base formed on said oxide and the upper end of said pillar extending through said dielectric layer.

2. The device of claim 1 wherein the substrate is a silicon wafer having plane, parallel upper and lower surfaces, the upper surface being covered by a first layer of oxide and the lower surface being covered by a second layer of oxide and wherein said micro-coil is formed within a trench formed through said first oxide layer and terminating within said wafer.

3. The device of claim 2 wherein said trench has a width of approximately 3 microns and a depth of approximately 10 microns to provide said micro-coil with an aspect ratio of approximately 10/3.

4. The device of claim 1 wherein said pillar is formed of the electroless plated ferromagnetic material NiCoP and said patterned metal base is a patterned bi-layer comprising a layer of Al formed on a layer of Ti.

5. The device of claim 1 wherein said dielectric layer is a layer of BCB formed to a thickness between approximately 2 and 5 microns.

6. The device of claim 1, wherein said micro-coil is shaped as a curved spiral, a square spiral, a meander coil with rectangular loops, a pair of interdigitated meander coils, a pair of independent concentric circular spirals wherein an inner spiral is formed entirely within an outer spiral, a pair of interdigitated circular spirals, a meander coil with small rectangular loops formed within the larger loops, a meander coil with small circular or elliptical loops formed within the larger loops, a semi-spiral coil, an array of spirals having a common central axis, or as arrays of such shapes connected in series or in parallel.

7. The device of claim 1 wherein the bonding pads are formed as a patterned bilayer of Ti/Al formed over a Cu mesh of intersecting Cu filled trenches and are connected directly to said micro-coil ends or to conducting bridging leads that are connected to similar bonding-pads formed on said micro-coil ends.

* * * * *